US012225730B2

(12) United States Patent
Lee et al.

(10) Patent No.: US 12,225,730 B2
(45) Date of Patent: Feb. 11, 2025

(54) THREE-DIMENSIONAL SEMICONDUCTOR MEMORY DEVICE AND ELECTRONIC SYSTEM INCLUDING THE SAME

(71) Applicant: SAMSUNG ELECTRONICS CO., LTD., Suwon-si (KR)

(72) Inventors: Sehoon Lee, Seoul (KR); Byoungil Lee, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 671 days.

(21) Appl. No.: 17/377,840

(22) Filed: Jul. 16, 2021

(65) Prior Publication Data

US 2022/0115390 A1 Apr. 14, 2022

(30) Foreign Application Priority Data

Oct. 13, 2020 (KR) ........................ 10-2020-0131991

(51) Int. Cl.

*H10B 43/35* (2023.01)
*H01L 23/522* (2006.01)
*H10B 41/10* (2023.01)
*H10B 41/27* (2023.01)
*H10B 41/35* (2023.01)

(Continued)

(52) U.S. Cl.

CPC ......... *H10B 43/35* (2023.02); *H01L 23/5226* (2013.01); *H10B 41/10* (2023.02); *H10B 41/27* (2023.02); *H10B 41/35* (2023.02); *H10B 41/46* (2023.02); *H10B 43/10* (2023.02); *H10B 43/27* (2023.02); *H10B 43/40* (2023.02)

(58) Field of Classification Search

CPC ........ H10B 43/35; H10B 41/10; H10B 41/27; H10B 41/35; H10B 41/46; H01L 23/5226; H01L 21/76877; H01L 29/792

See application file for complete search history.

(56) References Cited

U.S. PATENT DOCUMENTS

| | | | |
|---|---|---|---|
| 8,455,940 | B2 | 6/2013 | Lee et al. |
| 9,564,451 | B1 | 2/2017 | Shin et al. |

(Continued)

FOREIGN PATENT DOCUMENTS

| | | |
|---|---|---|
| KR | 20180095499 A | 8/2018 |
| KR | 20200008828 A | 1/2020 |
| KR | 20200051100 A | 5/2020 |

*Primary Examiner* — Didarul A Mazumder
*Assistant Examiner* — Linda J. Fleck
(74) *Attorney, Agent, or Firm* — Myers Bigel, P.A.

(57) ABSTRACT

Disclosed are three-dimensional semiconductor memory devices, methods of fabricating the same, and electronic systems including the same. The device includes a substrate including a cell array region and an extension region, stack structures extending in a first direction and including gate electrodes stacked on the substrate, vertical structures penetrating the stack structures on the cell array region, a mold structure on a portion of the extension region, a first support structure extending in the first direction between the stack structures, second support structures penetrating the stack structures on the extension region and spaced apart in a second direction from the first support structure, and a third support structure surrounding the mold structure in a plan view. Respective top surfaces of ones of the second support structures and a top surface of the third support structure is higher than a top surface of ones of the vertical structures.

18 Claims, 24 Drawing Sheets

(51) Int. Cl.
*H10B 41/46* (2023.01)
*H10B 43/10* (2023.01)
*H10B 43/27* (2023.01)
*H10B 43/40* (2023.01)

(56) References Cited

U.S. PATENT DOCUMENTS 9,881,929 B1 1/2018 Ravikirthi et al.
10,038,006 B2 7/2018 Furihata et al.
10,050,052 B2 8/2018 Yoon et al.
10,438,963 B2 10/2019 Kim
10,804,289 B2 10/2020 Yang et al.
10,804,363 B2 10/2020 Hwang et al.
10,879,264 B1 * 12/2020 Otsu ...................... H10B 43/35
2017/0179026 A1 * 6/2017 Toyama ................. H10B 41/41
2018/0108667 A1 4/2018 Chang et al.
2019/0067321 A1 * 2/2019 Song ...................... H10B 41/20
2019/0280001 A1 * 9/2019 Terasawa .......... H01L 21/76865
2020/0027893 A1 * 1/2020 Yang ...................... H10B 41/50
2020/0058667 A1 2/2020 Baek
2020/0152585 A1 5/2020 Eom
2020/0183863 A1 * 6/2020 Park .................... G06F 13/1668
2020/0295025 A1 * 9/2020 Lu ........................... H01L 25/50
2020/0303307 A1 * 9/2020 Jang ....................... H10B 41/27
2021/0036010 A1 * 2/2021 Sim ........................ H10B 43/10
2021/0125660 A1 * 4/2021 Maejima .................. G11C 5/06
2021/0408034 A1 * 12/2021 Lee ........................ H10B 41/27
2022/0005824 A1 * 1/2022 Tanaka ................... H10B 41/10
2022/0165747 A1 * 5/2022 Yang ...................... H10B 41/10
2023/0013984 A1 * 1/2023 Otsu ...................... H10B 43/40

* cited by examiner 2210
2400
2100
I'
II'
2130
2500
2003
I
3210
3220
2300
2200
2003a
2003
2003b
2005
II
2001
2002
2004
2006
2000

MS1
130
120
130
120
113
111
100
30
11
10
CSP
CH1
CAR
EXR
I
I'
II
II'
110
33
25
23
27
21
29
PTR
31
PTR

CH2
CH2
CH2
CH2
CH2
CH2
MS2
MS1
120
130
120
130
120
CSP
130
120
130
120
113
111
CH1
30
11
10
110
100
33
25
23
27
21
29
PTR
31
PTR
I
I'
II
II'
CAR
EXR

VS
DSP VI PAD VSP
TR1
CH2
TR2
TR3
230
210
110
100
33
25
23
27
21
29
PTR
31
CH1
30
11
10
120
130
113
111
MS2
MS1
CAR
EXR
I
I'
II
II'

TR1
FL SP
CH2
TR2
TR3
VS
DSP VI PAD VSP
120
130
120
130
120
130
120
130
120
SCP2
SCP1
CH1
30
11
10
MS2
MS1
SC
CAR
EXR
I
I'
II
II'
PTR
250
230
210
110
100
33
31
25
23
27
21
29

250
230
210
110
100
33
25
23
27
21
29
PTR
TR3
TR2
RC
PTR
31
TR1
FL
SP
CH2
VS
DSP
VI
PAD
VSP
120
130
MS2
MS1
SCP2
SCP1
SC
CH1
30
11
10
CAR
EXR
I
I'
II
II'

THREE-DIMENSIONAL SEMICONDUCTOR MEMORY DEVICE AND ELECTRONIC SYSTEM INCLUDING THE SAME

CROSS-REFERENCE TO RELATED APPLICATION

This U.S. nonprovisional application claims priority under 35 U.S.C § 119 to Korean Patent Application No. 10-2020-0131991 filed on Oct. 13, 2020 in the Korean Intellectual Property Office, the disclosure of which is hereby incorporated by reference in its entirety.

BACKGROUND

The present inventive concepts relate to a three-dimensional semiconductor memory device and an electronic system including the same, and more particularly, to a nonvolatile three-dimensional semiconductor memory device including a vertical channel, a method of fabricating the same, and an electronic system including the same.

A need arises to have a semiconductor device capable of storing a large amount of data in an electronic system which reads data. Semiconductor devices have been highly integrated for high performance and low manufacturing costs, which are attributes desired by customers. Integration of typical two-dimensional or planar semiconductor devices is primarily determined by the area occupied by a unit memory cell. Thus, integration may be influenced by the level of technology for forming fine patterns. However, the expensive processing equipment needed to increase pattern fineness may set a practical limitation on increasing the integration of the two-dimensional or planar semiconductor devices. Therefore, three-dimensional semiconductor memory devices having three-dimensionally arranged memory cells have been proposed to increase integration.

SUMMARY

Some example embodiments of the present inventive concepts provide a three-dimensional semiconductor memory device whose stability and/or electrical properties are improved and a simplified method of fabricating the same.

Some example embodiments of the present inventive concepts provide an electronic system including the three-dimensional semiconductor memory device.

An objective of the present inventive concepts is not limited to the mentioned above, and other objectives which have not been mentioned above will be clearly understood to those skilled in the art from the following description.

According to some example embodiments of the present inventive concepts, a three-dimensional semiconductor memory device may include a substrate which includes a cell array region and an extension region, a plurality of stack structures which extend in a first direction and include a plurality of gate electrodes stacked on the substrate, a plurality of vertical structures which penetrate the stack structures on the cell array region; a mold structure on a portion of the extension region; a first support structure which extends in the first direction between the stack structures, a plurality of second support structures which penetrate the stack structures on the extension region and are spaced apart in a second direction from the first support structure, the second direction intersecting the first direction, and a third support structure which surrounds the mold structure in a plan view. Respective top surfaces of ones of the second support structures and a top surface of the third support structure may be higher than top surfaces of ones of the vertical structures with respect to the substrate defining a base reference level.

According to some example embodiments of the present inventive concepts, a three-dimensional semiconductor memory device may include a first substrate which includes a cell array region and an extension region, a peripheral circuit structure which includes a peripheral circuit on the first substrate, a second substrate on the peripheral circuit structure, and a cell array structure on the second substrate. The cell array structure may include a plurality of stack structures which extend in a first direction and include a plurality of gate electrodes and a plurality of interlayer dielectric layers which are alternately stacked on the second substrate, a plurality of vertical structures which penetrate the stack structures on the cell array region, respective bit-line contact plugs connected to each of the vertical structures, respective cell contact plugs connected to respective ones of the gate electrodes on the extension region, a mold structure on a portion of the extension region, a peripheral connection contact plug which penetrates the mold structure and the second substrate, and is electrically connected to the peripheral circuit structure, a first support structure which extends in the first direction between the stack structures, a plurality of second support structures which penetrate the stack structures on the extension region and are spaced apart in a second direction from the first support structure, the second direction intersecting the first direction, and a third support structure which surrounds the mold structure in a plan view. Top surfaces of ones of the second support structures and a top surface of the third support structure may be higher than top surfaces of ones of the vertical structures with respect to the second substrate defining a base reference level.

According to some example embodiments of the present inventive concepts, an electronic system may include a main board, a three-dimensional semiconductor memory device on the main board, and a controller on the main board that is electrically connected to the three-dimensional semiconductor memory device. The three-dimensional semiconductor memory device may include a first substrate which includes a cell array region and an extension region a peripheral circuit structure which includes a peripheral circuit on the first substrate a second substrate on the peripheral circuit structure a plurality of stack structures which extend in a first direction and include a plurality of gate electrodes stacked on the second substrate, a plurality of vertical structures which penetrate the stack structures on the cell array region, a mold structure on a portion of the extension region, a first support structure which extends in the first direction between the stack structures, a plurality of second support structures which penetrate the stack structures on the extension region and are spaced apart in a second direction from the first support structure, the second direction intersecting the first direction, a third support structure which surrounds the mold structure in plan view, and an input/output pad electrically connected to the peripheral circuit. Respective top surfaces of ones of the second support structures and a top surface of the third support structure may be higher than top surfaces of ones of the vertical structures with respect to the second substrate defining a base reference level.

DETAILED DESCRIPTION

With reference to the accompanying drawings, the following will now describe in detail a three-dimensional semiconductor memory device, a method of fabricating the same, and an electronic system including the same according to some example embodiments of the present inventive concepts.

Figure 1:
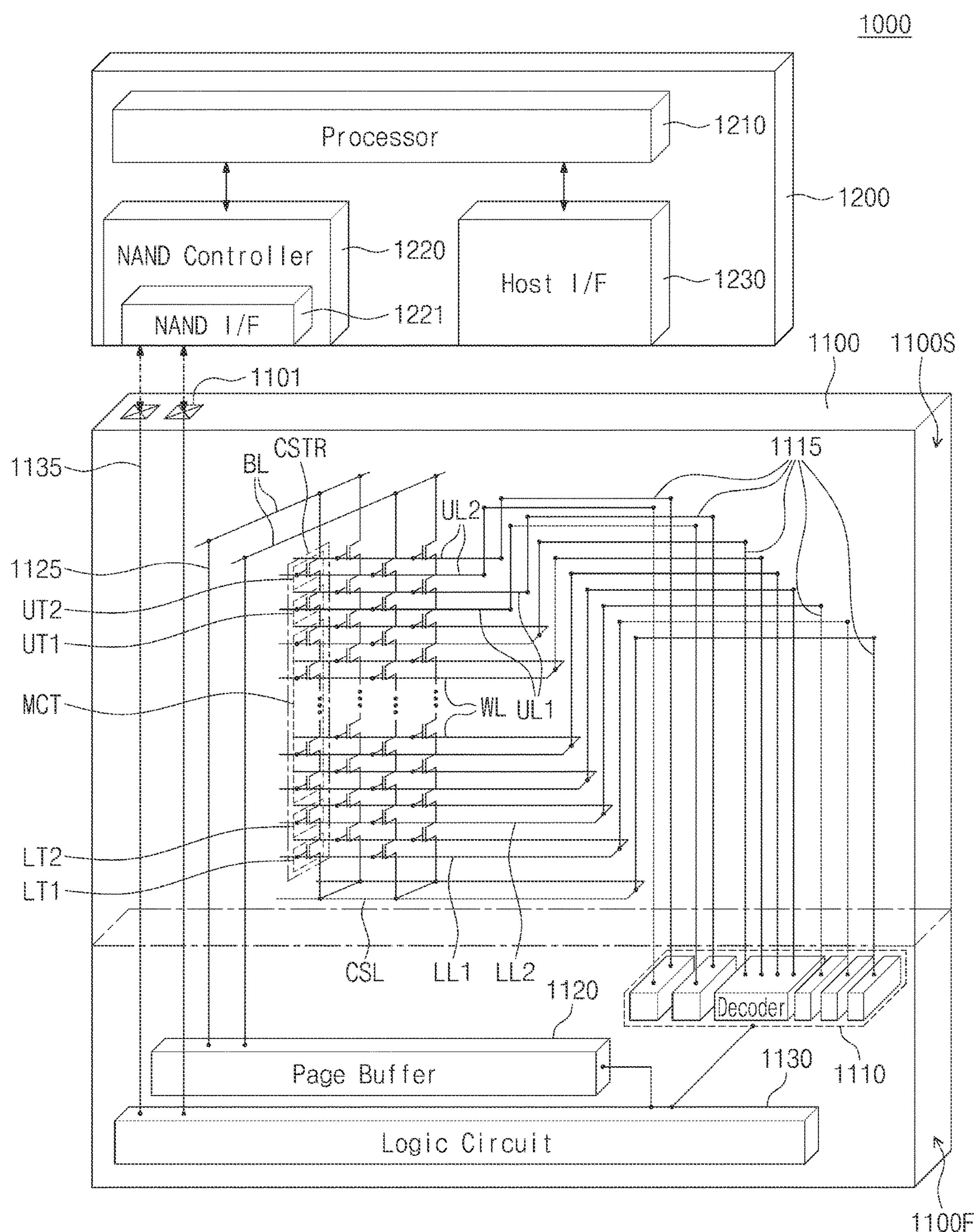
FIG. 1 illustrates a simplified block diagram showing an electronic system that includes a three-dimensional semiconductor memory device according to some example embodiments of the present inventive concepts.

FIG. 1 illustrates a simplified block diagram showing an electronic system that includes a three-dimensional semiconductor memory device according to some example embodiments of the present inventive concepts.

Referring to FIG. 1, an electronic system 1000 according to some example embodiments of the present inventive concepts may include a three-dimensional semiconductor memory device 1100 and a controller 1200 electrically connected to the three-dimensional semiconductor memory device 1100. The electronic system 1000 may be a storage device that includes a single or a plurality of three-dimensional semiconductor memory devices 1100 or may be an electronic device that includes the storage device. For example, the electronic system 1000 may be a solid state drive (SSD) device, a universal serial bus (USB), a computing system, a medical apparatus, and/or a communication apparatus, each of which includes a single or a plurality of three-dimensional semiconductor memory devices 1100.

The three-dimensional semiconductor memory device 1100 may be a nonvolatile memory device, such as a three-dimensional NAND Flash memory device, which will be discussed below. The three-dimensional semiconductor memory device 1100 may include a first region 1100F and a second region 1100S on the first region 1100F. For example, the first region 1100F may be disposed on a side of the second region 1100S. The first region 1100F may be a peripheral circuit region that includes a decoder circuit 1110, a page buffer 1120, and a logic circuit 1130. The second region 1100S may be a memory cell region that includes bit lines BL, a common source line CSL, word lines WL, first lines LL1 and LL2, second lines UL1 and UL2, and memory cell strings CSTR between the bit line BL and the common source line CSL.

On the second region 1100S, each of the memory cell strings CSTR may include first transistors LT1 and LT2 adjacent to the common source line CSL, second transistors UT1 and UT2 adjacent to the bit line BL, and a plurality of memory cell transistors MCT disposed between the first transistors LT1 and LT2 and the second transistors UT1 and UT2. The number of the first transistors LT1 and LT2 and of the second transistors UT1 and UT2 may change in accordance with embodiments.

For example, the first transistors LT1 and LT2 may include a ground selection transistor, and the second transistors UT1 and UT2 may include a string selection transistor. The first lines LL1 and LL2 may be gate electrodes of the first transistors LT1 and LT2, respectively. The word lines WL may be gate electrodes of the memory cell transistors MCT. The second lines UL1 and UL2 may be gate electrodes of the second transistors UT1 and UT2, respectively.

For example, the first transistors LT1 and LT2 may include a first erasure control transistor LT1 and a ground selection transistor LT2 that are connected in series. The second transistors UT1 and UT2 may include a string selection transistor UT1 and a second erase control transistor UT2 that are connected in series. One or both of the first and second erase control transistors LT1 and UT2 may be used to perform an erasure operation in which a gate induced drain leakage (GIDL) phenomenon is used to erase data stored in the memory cell transistors MCT.

The common source line CSL, the first lines LL1 and LL2, the word lines WL, and the second lines UL1 and UL2 may be electrically connected to the decoder circuit 1110 through first connection lines 1115 that extend from the first region 1100F toward the second region 1100S. The bit lines BL may be electrically connected to the page buffer 1120 through second connection lines 1125 that extend from the first region 1100F toward the second region 1100S.

On the first region 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The three-dimensional semiconductor memory device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first region 1100F toward the second region 1100S.

The controller 1200 may include a processor 1210, a NAND controller 1220, and a host interface 1230. For example, the electronic system 1000 may include a plurality of three-dimensional semiconductor memory devices 1100, and in this case, the controller 1200 may control the plurality of three-dimensional semiconductor memory devices 1100.

The processor 1210 may control overall operations of the electronic system 1000 including the controller 1200. The processor 1210 may operate based on certain firmware, and may control the NAND controller 1220 to access the three-dimensional semiconductor memory device 1100. The NAND controller 1220 may include a NAND interface 1221 that processes communication with the three-dimensional semiconductor memory device 1100. The NAND interface 1221 may be used to transfer therethrough a control command which is intended to control the three-dimensional semiconductor memory device 1100, data which is intended to be written on the memory cell transistors MCT of the three-dimensional semiconductor memory device 1100, and/or data which is intended to be read from the memory cell transistors MCT of the three-dimensional semiconductor memory device 1100. The host interface 1230 may provide the electronic system 1000 with communication with an external host. When a control command is received through the host interface 1230 from an external host, the three-dimensional semiconductor memory device 1100 may be controlled by the processor 1210 in response to the control command.

Figure 2:
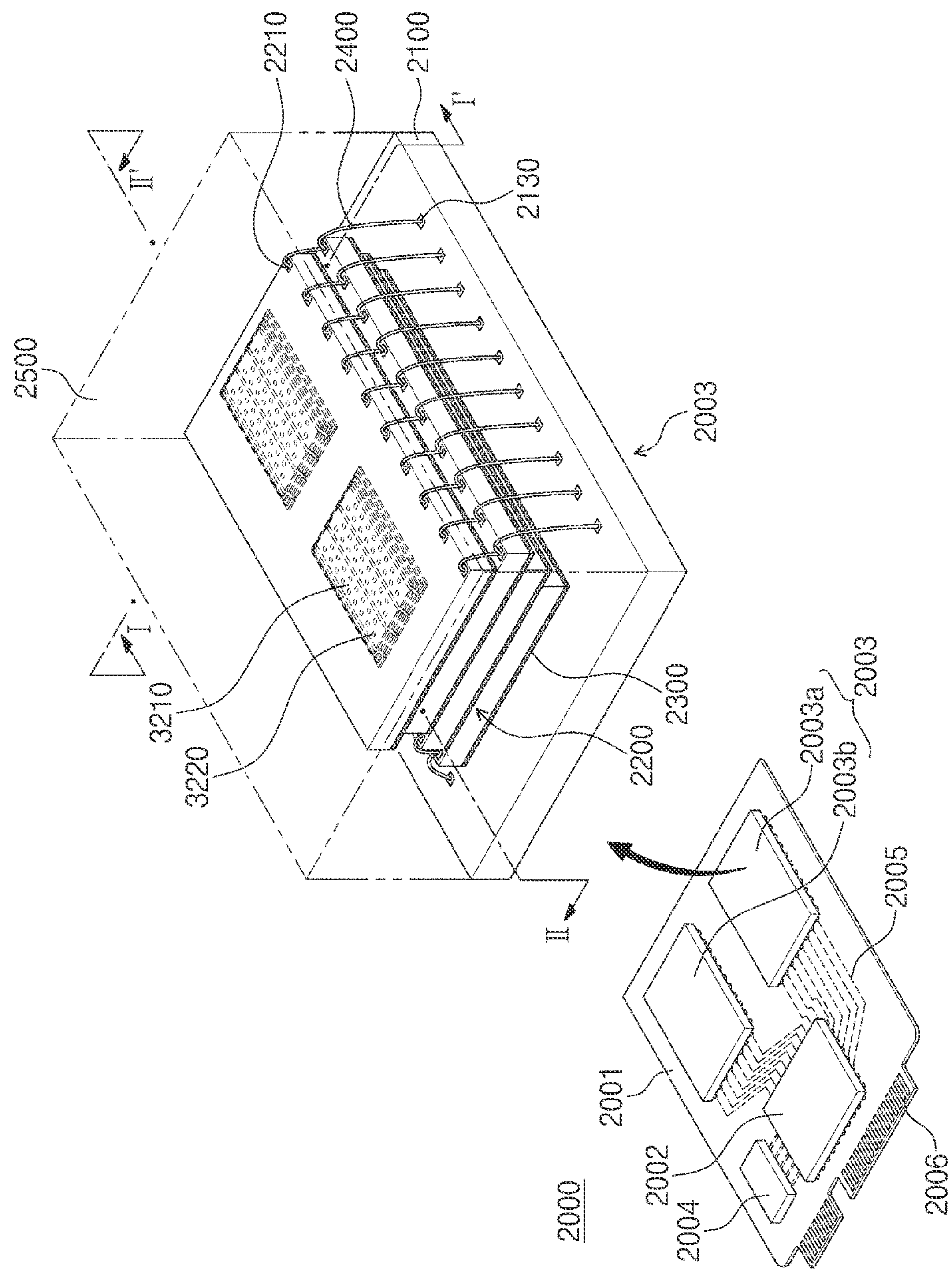
FIG. 2 illustrates a simplified perspective view showing an electronic system that includes a three-dimensional semiconductor memory device according to some example embodiments of the present inventive concepts.

FIG. 2 illustrates a simplified perspective view showing an electronic system that includes a three-dimensional semiconductor memory device according to some example embodiments of the present inventive concepts.

Referring to FIG. 2, an electronic system 2000 according to some example embodiments of the present inventive concepts may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 provided in the main board 2001.

The main board 2001 may include a connector 2006 including a plurality of pins which are provided to have connection with an external host. The number and arrangement of the plurality of pins on the connector 2006 may be changed based on a communication interface between the electronic system 2000 and an external host. The electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). For example, the electronic system 2000 may operate with power supplied through the connector 2006 from the external host. The electronic system 2000 may further include a power management integrated circuit (PMIC) that distributes the power supplied from the external host to the controller 2002 and the semiconductor package 2003.

The controller 2002 may write data to a semiconductor package 2003, may read data from a semiconductor package 2003, or may increase an operating speed of the electronic system 2000.

The DRAM 2004 may be a buffer memory that reduces a difference in speed between the external host and the semiconductor package 2003 that serves as data storage space. The DRAM 2004 included in the electronic system 2000 may operate as a cache memory, and may provide a space for temporary data storage in a control operation of the semiconductor package 2003. When the DRAM 2004 is included in the electronic system 2000, the controller 2002 may include not only a NAND controller for control of the semiconductor package 2003, but a DRAM controller for control of the DRAM 2004.

The semiconductor package 2003 may include a first semiconductor package 2003*a* and a second semiconductor package 2003*b* that are spaced apart from each other. Each of the first and second semiconductor packages 2003*a* and 2003*b* may include a plurality of semiconductor chips 2200. Each of the first and second semiconductor packages 2003*a* and 2003*b* may include a package substrate 2100, semiconductor chips 2200 on the package substrate 2100, adhesive layers 2300 on bottom surfaces of the semiconductor chips 2200, connection structures 2400 that electrically connect the semiconductor chips 2200 to the package substrate 2100, and a molding layer 2500 that lies on the package substrate 2100 and covers or overlaps the semiconductor chips 2200 and the connection structures 2400.

The package substrate 2100 may be an integrated circuit board including package upper pads 2130. Each of the semiconductor chips 2200 may include input/output pads 2210. Each of the input/output pads 2210 may correspond to the input/output pad 1101 of FIG. 1. Each of the semiconductor chips 2200 may include gate stack structures 3210 and vertical channel structures 3220. Each of the semiconductor chips 2200 may include a three-dimensional semiconductor memory device which will be discussed below.

For example, the connection structures 2400 may be bonding wires that electrically connect the input/output pads 2210 to the package upper pads 2130. On each of the first and second semiconductor packages 2003*a* and 2003*b*, the semiconductor chips 2200 may be electrically connected to each other in a wire bonding manner, and may be electrically connected to the package upper pads 2130 of the package substrate 2100. In some example embodiments, on each of the first and second semiconductor packages 2003*a* and 2003*b*, the semiconductor chips 2200 may be electrically connected to each other using through-silicon vias (TSVs) instead of the connection structures 2400 or the bonding wires.

For example, the controller 2002 and the semiconductor chips 2200 may be included in a single package. For example, the controller 2002 and the semiconductor chips 2200 may be mounted on a separate interposer substrate other than the main board 2001, and may be connected to each other through wiring lines provided in the interposer substrate.

Figure 3:
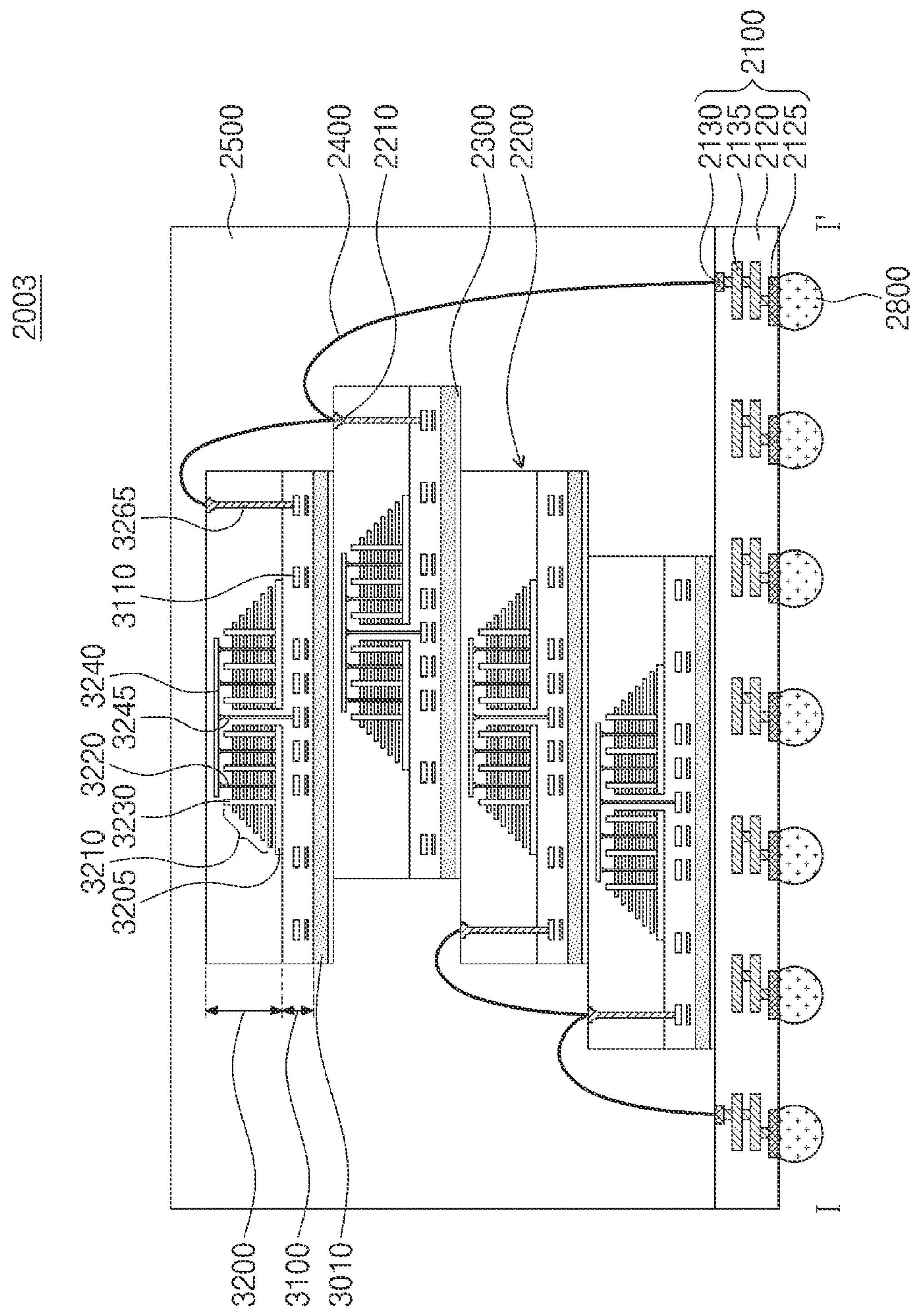
FIGS. 3 and 4 illustrate cross-sectional views respectively taken along lines I-I' and II-II' of FIG. 2, showing a semiconductor package that includes a three-dimensional semiconductor memory device according to some example embodiments of the present inventive concepts.
Figure 4:
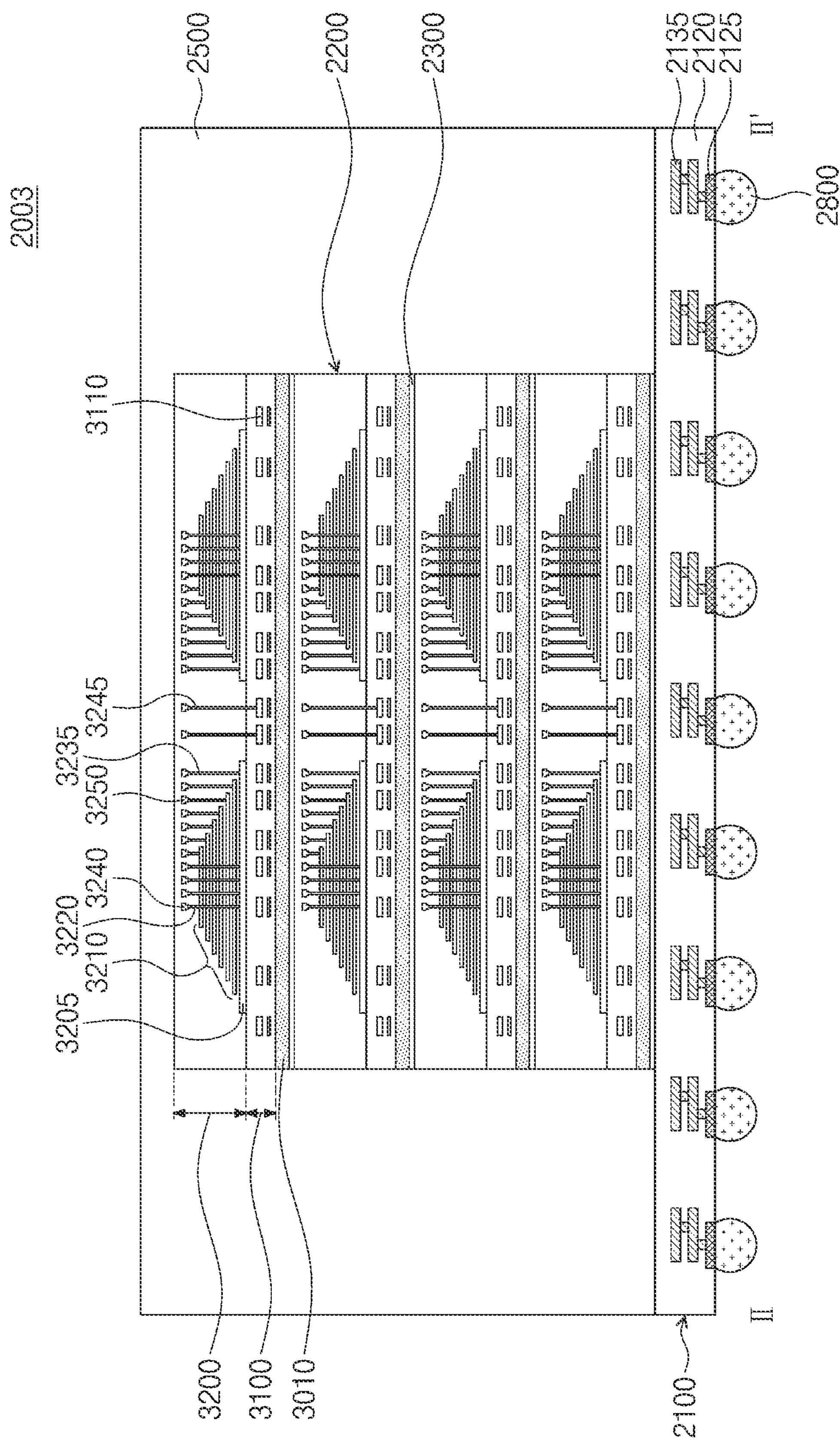

FIGS. 3 and 4 illustrate cross-sectional views respectively taken along lines I-I' and II-II' of FIG. 2, showing a semiconductor package that includes a three-dimensional semiconductor memory device according to some example embodiments of the present inventive concepts.

Referring to FIGS. 3 and 4, a semiconductor package 2003 may include a package substrate 2100, a plurality of semiconductor chips 2200 on the package substrate 2100, and a molding layer 2500 that covers or overlaps the package substrate 2100 and the plurality of semiconductor chips 2200.

The package substrate 2100 may include a package substrate body 2120, package upper pads 2130 on a top surface of the package substrate body 2120, package lower pads 2125 disposed or exposed on a bottom surface of the package substrate body 2120, and internal wiring lines 2135 that lie in the package substrate body 2120 and electrically connect the package upper pads 2130 to the package lower pads 2125. The package upper pads 2130 may be electrically connected to connection structures 2400. The package lower pads 2125 may be connected through conductive connectors 2800 to the wiring patterns 2005 in the main board 2001 of the electronic system 2000 depicted in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral lines 3110. The second structure 3200 may include a common source line 3205, a gate stack structure 3210 on the common source line 3205, vertical channel structures 3220 and separation structures 3230 that penetrate the gate stack structure 3210, bit lines 3240 electrically connected to the vertical channel structures 3220, and gate connection lines 3235 and conductive lines 3250 that are electrically connected to the word lines WL of FIG. 1.

Each of the semiconductor chips 2200 may include through lines 3245 that have electrical connection with the peripheral lines 3110 of the first structure 3100 and that extend into the second structure 3200. The through line 3245 may penetrate the gate stack structure 3210, and may further be disposed outside the gate stack structure 3210. Each of the semiconductor chips 2200 may further include an input/output connection line 3265 that has electrical connection with the peripheral line 3110 of the first structure 3100 and that extends into the second structure 3200, and may also further include an input/output pad 2210 electrically connected to the input/output connection line 3265.

Figure 5:
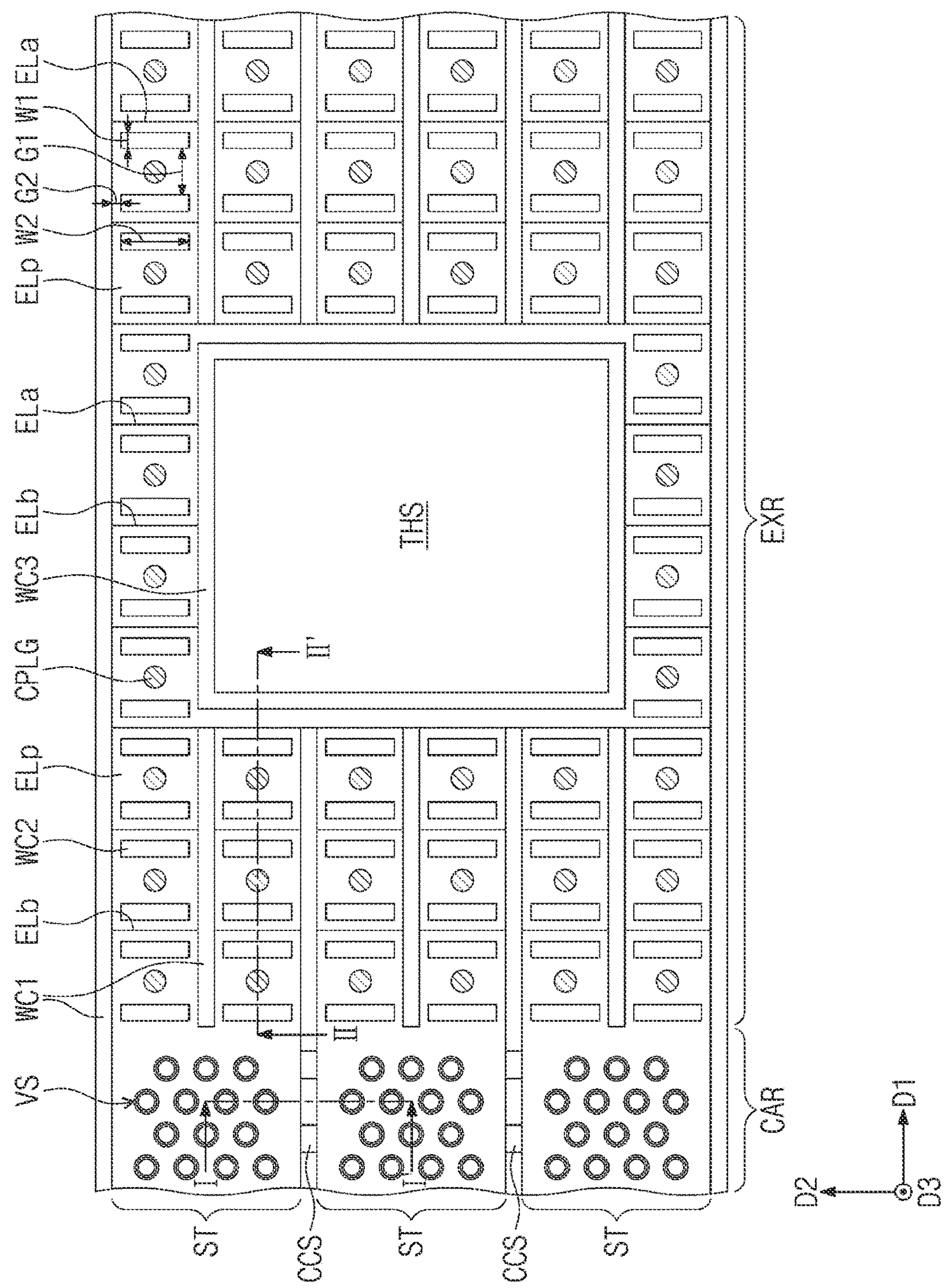
FIG. 5 illustrates a plan view showing a three-dimensional semiconductor memory device according to some example embodiments of the present inventive concepts.
Figure 6:
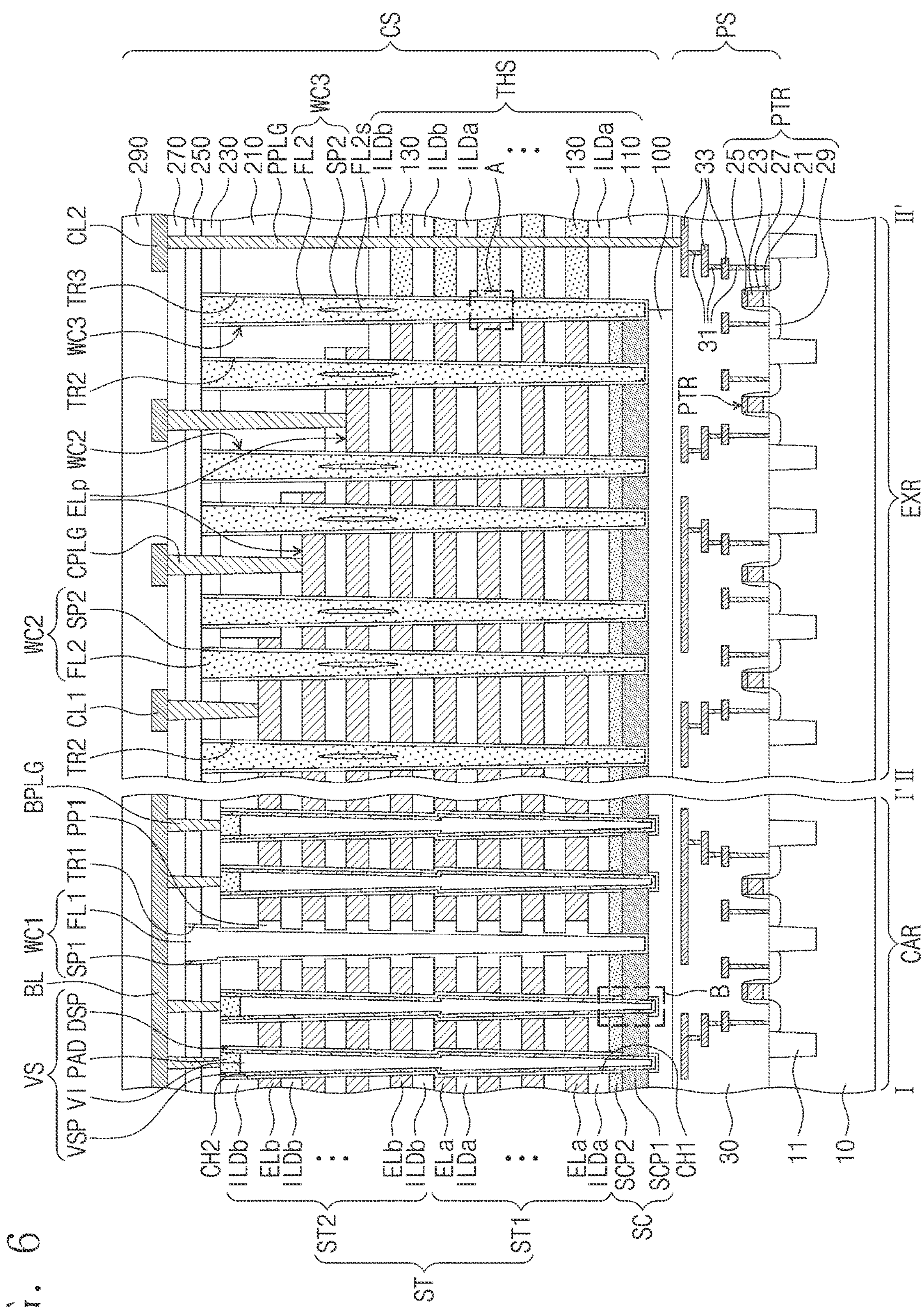
FIGS. 6 and 9 illustrate cross-sectional views taken along lines I-I' and II-II' of FIG. 5, showing a three-dimensional semiconductor memory device according to some example embodiments of the present inventive concepts.

FIG. 5 illustrates a plan view showing a three-dimensional semiconductor memory device according to some example embodiments of the present inventive concepts. FIG. 6 illustrates a cross-sectional view taken along lines I-I' and II-II' of FIG. 5, showing a three-dimensional semiconductor memory device according to some example embodiments of the present inventive concepts.

Referring to FIGS. 5 and 6, a first substrate 10 may be provided which includes a cell array region CAR and an extension region EXR. The first substrate 10 may have a top surface that is parallel to first and second directions D1 and D2 and is perpendicular to a third direction D3. The first, second, and third directions D1, D2, and D3 may be orthogonal to each other. The extension region EXR may extend in the first direction D2 from the cell array region CAR.

The first substrate 10 may be, for example, a silicon substrate, a silicon-germanium substrate, a germanium substrate, or a monocrystalline epitaxial layer grown on a monocrystalline silicon substrate. A device isolation layer 11 may be disposed in the first substrate 10. The device isolation layer 11 may define active regions of the first substrate 10. The device isolation layer 11 may include, for example, silicon oxide.

A peripheral circuit structure PS may be provided on the first substrate 10. The peripheral circuit structure PS may correspond to the first region 1100F of FIG. 1. The peripheral circuit structure PS may include peripheral transistors PTR on the active region of the first substrate 10, peripheral contact plugs 31, peripheral circuit lines 33 electrically connected though the peripheral contact plugs 31 to the peripheral transistors PTR, and a peripheral circuit dielectric layer 30 that surrounds the peripheral transistors PTR, the peripheral contact plugs 31, and the peripheral circuit lines 33.

A peripheral circuit may include the peripheral transistors PTR, the peripheral contact plugs 31, and the peripheral circuit lines 33. For example, the peripheral transistors PTR may include the decoder circuit 1110, the page buffer 1120, and the logic circuit 1130 that are depicted in FIG. 1. For example, each of the peripheral transistors PTR may include a peripheral gate dielectric layer 21, a peripheral gate electrode 23, a peripheral capping pattern 25, a peripheral gate spacer 27, and peripheral source/drain regions 29.

The peripheral gate dielectric layer 21 may be provided between the peripheral gate electrode 23 and the first substrate 10. The peripheral capping pattern 25 may be provided on the peripheral gate electrode 23. The peripheral gate spacer 27 may cover, overlap, or be on a sidewall of the peripheral gate dielectric layer 21, of the peripheral gate electrode 23, and of the peripheral capping pattern 25. The peripheral source/drain regions 29 may be provided in the first substrate 10 adjacent to opposite sides of the peripheral gate electrode 23.

The peripheral circuit lines 33 may be electrically connected through the peripheral contact plugs 31 to the peripheral transistors PTR. Each of the peripheral transistors PTR may be, for example, an NMOS transistor, a PMOS transistor, or a gate-all-around type transistor. For example, the peripheral contact plugs 31 may each have a width in the first direction D1 or the second direction D2 that increases in the third direction D3. The peripheral contact plugs 31 and the peripheral circuit lines 33 may each include a conductive material, such as metal.

The peripheral circuit dielectric layer 30 may be provided on the top surface of the first substrate 10. On the first substrate 10, the peripheral circuit dielectric layer 30 may cover or overlap the peripheral transistors PTR, the peripheral contact plugs 31, and the peripheral circuit lines 33. The peripheral circuit dielectric layer 30 may include a plurality of dielectric layers that includes a multi-layered structure. For example, the peripheral circuit dielectric layer 30 may include one or more of silicon oxide, silicon nitride, silicon oxynitride, and/or low-k dielectric materials.

A second substrate 100 may be provided on the peripheral circuit dielectric layer 30. The second substrate 100 may be a semiconductor substrate including a semiconductor material. The second substrate 100 may include, for example, silicon (Si), germanium (Ge), silicon germanium (SiGe), gallium arsenic (GaAs), indium gallium arsenic (InGaAs), aluminum gallium arsenic (AlGaAs), or a mixture thereof.

The peripheral circuit structure PS may be provided thereon with a cell array structure CS that includes stack structures ST, vertical structures VS, a mold structure THS, and first, second, and third support structures WC1, WC2, and WC3. The cell array structure CS may correspond to the second region 1100S of FIG. 1. The following will discuss in detail components of the cell array structure CS.

A plurality of stack structures ST may be provided on the second substrate 100. When viewed in plan as shown in FIG. 5, the stack structures ST may be arranged along the second direction D2 and spaced apart from each other in the second direction D2. The stack structures ST may correspond to the gate stack structures 3210 of FIGS. 2 to 4. For convenience of description, the following explanation will focus on a single stack structure ST, but this explanation may also be applicable to other stack structures ST.

The stack structure ST may include interlayer dielectric layers ILDa and ILDb and gate electrodes ELa and ELb that are alternately stacked. The gate electrodes ELa and ELb may correspond to the word lines WL, the first lines LL1 and LL2, and the second lines UL1 and UL2 that are depicted in FIG. 1.

The stack structure ST may include, for example, a first stack structure ST1 on the second substrate 100 and a second stack structure ST2 on the first stack structure ST1. The first stack structure ST1 may include first interlayer dielectric layers ILDa and first gate electrodes ELa that are alternately stacked, and the second stack structure ST2 may include second interlayer dielectric layers ILDb and second gate electrodes ELb that are alternately stacked. The first and second gate electrodes ELa and ELb may have their thicknesses in the third direction D3, with respective thicknesses that are substantially the same as each other. In the description below, the term "thickness" may indicate a thickness in the third direction D3.

The first and second gate electrodes ELa and ELb may have their lengths in the first direction D1 that decrease with increasing distance (or in the third direction D3) from the second substrate 100. For example, each of the first and second gate electrodes ELa and ELb may have a length in the first direction D1 that is greater than a length in the first direction D1 of a next overlying gate electrode. A lowermost one of the first gate electrodes ELa included in the first stack structure ST1 may have the largest length in the first direction D1, and an uppermost one of the second gate electrodes ELb included in the second stack structure ST2 may have the smallest length in the first direction D1.

The first and second gate electrodes ELa and ELb may have their pad portions ELp on the extension region EXR. The pad portions ELp of the first and second gate electrodes ELa and ELb may be disposed at their positions that are horizontally and vertically different from each other. The pad portions ELp may include a stepwise structure along the first direction D1.

The stepwise structure may be arranged such that each of the stack structures ST1 and ST2 may have a thickness which decreases with increasing distance from an outermost one of the vertical structures VS which will be discussed below, and that the first and second gate electrodes ELa and ELb may have their sidewalls spaced apart from each other along the first direction D1 at a regular interval.

The first and second gate electrodes ELa and ELb may include, for example, at least one selected from doped semiconductors (e.g., doped silicon), metals (e.g., tungsten, copper, or aluminum), conductive metal nitrides (e.g., titanium nitride, or tantalum nitride), and/or transition metals (e.g., titanium or tantalum).

The first and second interlayer dielectric layers ILDa and ILDb may be provided between the first and second gate electrodes ELa and ELb, and may each have a sidewall aligned with that of an underlying one of the first and second gate electrodes ELa and ELb. For example, likewise the first and second gate electrodes ELa and ELb, the first and second interlayer dielectric layers ILDa and ILDb may have their lengths in the first direction D1 that decrease with increasing distance from the second substrate 100.

A lowermost one of the second interlayer dielectric layers ILDb may be in contact with an uppermost one of the first gate electrodes ELa. For example, each of the first and second interlayer dielectric layers ILDa and ILDb may have a thickness less than that of each of the first and second gate electrodes ELa and ELb. For example, a lowermost one of the first interlayer dielectric layers ILDa may have a thickness less than that of each of other interlayer dielectric layers ILDa and ILDb. For example, an uppermost one of the second interlayer dielectric layers ILDb may have a thickness greater than that of each of other interlayer dielectric layers ILDa and ILDb.

Except for the lowermost one of the first interlayer dielectric layers ILDa and the uppermost one of the second interlayer dielectric layers ILDb, other interlayer dielectric layers ILDa and ILDb may have substantially the same thickness. In particular, the thickness of the lowermost one of the second interlayer dielectric layers ILDb may be substantially the same as that of each of adjacent other interlayer dielectric layers ILDa and ILDb. This, however, is merely an example, and the first and second interlayer dielectric layers ILDa and ILDb may have their thicknesses that are changed based on properties of a semiconductor device.

The first and second interlayer dielectric layers ILDa and ILDb may include, for example, one or more of silicon oxide, silicon nitride, silicon oxynitride, and/or low-k dielectric materials. For example, the first and second interlayer dielectric layers ILDa and ILDb may include high-density plasma (HDP) oxide or tetraethyl orthosilicate (TEOS).

A source structure SC may be provided between the second substrate 100 and the lowermost one of the first interlayer dielectric layers ILDa. The source structure SC may correspond to the common source line CSL of FIG. 1 or the common source line 3205 of FIGS. 3 and 4. The source structure SC may extend in the first direction D1 in parallel to the first and second gate electrodes ELa and ELb. The source structure SC may include a first source conductive pattern SCP1 and a second source conductive pattern SCP2 that are sequentially stacked. The second source conductive pattern SCP2 may be provided between the first source conductive pattern SCP1 and the lowermost one of the first interlayer dielectric layers ILDa. The first source conductive pattern SCP1 may have a thickness greater than that of the second source conductive pattern SCP2. Each of the first and second source conductive patterns SCP1 and SCP2 may include an impurity-doped semiconductor material. For example, the first source conductive pattern SCP1 may have an impurity concentration greater than that of the second source conductive pattern SCP2.

On the cell array region CAR, a plurality of vertical structures VS may be provided to penetrate the stack structure ST and the source structure SC. The vertical structures VS may penetrate at least a portion of the second substrate 100, and each of the vertical structures VS may have a bottom surface at a lower level than that of a bottom surface of the source structure SC.

When viewed in plan as shown in FIG. 5, the vertical structures VS may be zigzag arranged along the first direction D1. The vertical structures VS may not be provided on the extension region EXR. The vertical structures VS may correspond to the vertical channel structures 3220 of FIGS. 2 to 4. The vertical structures VS may correspond to channels of the first transistors LT1 and LT2, of the memory cell transistors MCT, and of the second transistors UT1 and UT2 that are depicted in FIG. 1.

For example, the vertical structures VS may be provided in first vertical channels CH1 that penetrate in the third direction D3 through the first stack structure ST1 and the source structure SC, and also in second vertical channels CH2 that penetrate in the third direction D3 through the second stack structure ST2. Each of the first and second vertical channels CH1 and CH2 may have a width in the first direction D1 or the second direction D2 that decreases in the third direction D3. The first and second vertical channels CH1 and CH2 may be connected to each other. As discussed below with reference to FIG. 8, a portion of the source structure SC may protrude into the first vertical channel CH1.

Each of the second vertical channels CH2 may have a diameter at a bottom end less than a diameter at a top end of each of the first vertical channels CH1, and a step difference may be provided at a boundary between the first and second vertical channels CH1 and CH2. The present inventive concepts, however, are not limited thereto, and differently from that shown, one of the vertical structures VS may be provided in three or more vertical channels that have a step difference at each of two or more boundaries therebetween, and one of the vertical structures VS may be provided in one vertical channel that has a flat sidewall with no step difference.

Each of the vertical structures VS may include a data storage pattern DSP that conformally covers or overlaps a sidewall of each of the first and second vertical channels CH1 and CH2, a vertical semiconductor pattern VSP that conformally covers a sidewall of the data storage pattern DSP, a buried dielectric pattern VI that fills an inner space, surrounded by the vertical semiconductor pattern VSP, of each of the first and second vertical channels CH1 and CH2, and a conductive pad PAD provided in a space surrounded by the buried dielectric pattern VI and the vertical semiconductor pattern VSP. The vertical structures VS may each have a top surface that has, for example, a circular shape, an oval shape, or a bar shape.

The vertical semiconductor pattern VSP may be provided between the data storage pattern DSP and the buried dielectric pattern VI and between the data storage pattern DSP and the conductive pad PAD. The vertical semiconductor pattern VSP may have a macaroni shape or a pipe shape whose bottom end is closed. The data storage pattern DSP may have a macaroni shape or a pipe shape whose bottom end is opened. The vertical semiconductor pattern VSP may include, for example, an impurity-doped semiconductor material, an impurity-undoped intrinsic semiconductor material, and/or a polycrystalline semiconductor material. As discussed below with reference to FIG. 8, a portion of the source structure SC may protrude into the first vertical channel CH1 to come into contact with the vertical semiconductor pattern VSP. The conductive pad PAD may include, for example, an impurity-doped semiconductor material or a conductive material.

The mold structure THS may be provided on a portion of the extension region EXR. The mold structure THS may include a lower dielectric pattern 110, and may also include interlayer dielectric layers ILDa and ILDb and sacrificial layers 130 that are alternately stacked on the lower dielectric pattern 110.

The lower dielectric pattern 110 may be in contact with the peripheral circuit dielectric layer 30. The lower dielectric pattern 110 may have a bottom surface in contact with a top surface of the peripheral circuit dielectric layer 30, and may have a top surface at substantially the same level as that of a top surface of the second source conductive pattern SCP2. The lower dielectric pattern 110 may be spaced apart in the first direction D1 from the source structure SC. The lower dielectric pattern 110 may include, for example, silicon oxide.

When viewed in plan as shown in FIG. 5, the mold structure THS may be surrounded by the stack structures ST, and may be spaced apart in the first direction D1 or the second direction D2 from the stack structures ST across the third support structure WC3 which will be discussed below. The interlayer dielectric layers ILDa and ILDb of the mold structure THS may be spaced apart in the first direction D1 from the interlayer dielectric layers ILDa and ILDb of the stack structures ST, and the sacrificial layers 130 of the mold structure THS may be spaced apart in the first direction D1 from the gate electrodes ELa and ELb of the stack structures ST. The interlayer dielectric layers ILDa and ILDb and the sacrificial layers 130 of the mold structure THS may have their sidewalls aligned with that of the third support structure WC3 which will be discussed below.

The interlayer dielectric layers ILDa and ILDb of the mold structure THS may be located at the same level as that of the interlayer dielectric layers ILDa an ILDb of the stack structures ST, and may have the same thickness and material as those of the interlayer dielectric layers ILDa and ILDb of the stack structures ST. The sacrificial layers 130 of the mold structure THS may be located at approximately the same level as that of the gate electrodes ELa and ELb of the stack structures ST with respect to the second substrate 100 and may have the same thickness as that of the gate electrode ELa and ELb of the stack structures ST, but may have a different material from that of the gate electrode ELa and ELb of the stack structures ST. The sacrificial layers 130 may include a material having an etch selectivity with respect to the interlayer dielectric layers ILDa and ILDb. The sacrificial layers 130 may include, for example, silicon nitride.

The number of the interlayer dielectric layers ILDa and ILDb and of the sacrificial layers 130 included in the mold structure THS are merely examples, and the present inventive concepts are not limited to that shown. The number of the interlayer dielectric layers ILDa and ILDb and of the sacrificial layers 130 may be changed depending on position of the mold structure THS.

On the extension region EXR, a planarized dielectric layer 210 may be provided to cover the stack structures ST and the mold structure THS. For example, the planarized dielectric layer 210 may cover or overlap the stepwise structure, and may be provided on the pad portions ELp of the gate electrodes ELa and ELb included in the stack structures ST and on an uppermost one of the interlayer dielectric layers ILDa and ILDb included in the mold structure THS.

The planarized dielectric layer 210 may have a substantially flat top surface. The top surface of the planarized dielectric layer 210 may be substantially coplanar with uppermost surfaces of the stack structures ST that are in the cell array region CAR. For example, the top surface of the planarized dielectric layer 210 may be substantially coplanar with that of an uppermost one of the interlayer dielectric layers ILDa and ILDb included in the stack structures ST.

The planarized dielectric layer 210 may include a single dielectric layer or a plurality of stacked dielectric layers. The planarized dielectric layer 210 may include, for example, one or more of silicon oxide, silicon nitride, silicon oxynitride, and/or high-k dielectric materials. The planarized dielectric layer 210 may include a dielectric material different from that of the interlayer dielectric layers ILDa and ILDb included in the stack structures ST. For example, when the interlayer dielectric layers ILDa and ILDb of the stack structures include high-density plasma oxide, the planarized dielectric layer 210 may include tetraethyl ortho silicate (TEOS).

A first upper dielectric layer 230 may be provided on the planarized dielectric layer 210 and the stack structures ST. The first upper dielectric layer 230 may cover or overlap the top surface of the planarized dielectric layer 210 and the top surface of an uppermost one of the interlayer dielectric layers ILDa and ILDb included in the stack structures ST. In addition, the first upper dielectric layer 230 may cover or overlap a top surface of each of the vertical structures VS. For example, the first upper dielectric layer 230 may cover or overlap a top surface of the conductive pad PAD included in each of the vertical structures VS.

A second upper dielectric layer 250 and a third upper dielectric layer 270 may be sequentially provided on the first upper dielectric layer 230. The second upper dielectric layer 250 may cover or overlap a top surface of the first upper dielectric layer 230, a top surface of each of the second support structures WC2 which will be discussed below, and a top surface of the third support structure WC3 which will be discussed below. The third upper dielectric layer 270 may cover or overlap a top surface of the second upper dielectric layer 250 and a top surface of each of the first support structures WC1 which will be discussed below.

Each of the first, second, and third upper dielectric layers 230, 250, and 270 may include a single dielectric layer or a plurality of stacked dielectric layers. Each of the first, second, and third upper dielectric layers 230, 250, and 270 may include, for example, one or more of silicon oxide, silicon nitride, silicon oxynitride, and/or low-k dielectric materials. For example, each of the first, second, and third upper dielectric layers 230, 250, and 270 may include a dielectric material that is substantially the same as that of the planarized dielectric layer 210 and is different from that of the interlayer dielectric layers ILDa and ILDb included in the stack structures ST.

Bit-line contact plugs BPLG may be provided to penetrate the first, second, and third upper dielectric layers 230, 250, and 270 and to have connection with the vertical structures VS. Each of the bit-line contact plugs BPLG may be in direct contact with the conductive pad PAD of a corresponding one of the vertical structures VS.

Cell contact plugs CPLG may be provided to penetrate the first, second, and third upper dielectric layers 230, 250, and 270 and portions of the interlayer dielectric layers ILDa and ILDb included in the stack structures ST and to have connection with the gate electrodes ELa and ELb. On the extension region EXR, the cell contact plugs CPLG may penetrate the planarized dielectric layer 210 and to have direct contact with the pad portions ELp of the gate electrodes ELa and ELb. However, the cell contact plugs CPLG may be separate from and may not be provided on the mold structure THS.

A peripheral connection contact plugs PPLG may be provided to penetrate the first, second, and third upper dielectric layers 230, 250, and 270, the planarized dielectric layer 210, the mold structure THS, and at least a portion of the peripheral circuit dielectric layer 30 and to have electrical connection with the peripheral transistor PTR of the peripheral circuit structure PS. The peripheral connection contact plug PPLG may penetrate the interlayer dielectric layers ILDa and ILDb, the sacrificial layers 130, and the lower dielectric pattern 110 of the mold structure THS. The peripheral connection contact plug PPLG may be in direct contact with one of the peripheral circuit lines 33 included in the peripheral circuit structure PS. The peripheral connection contact plug PPLG may be spaced apart from the source structure SC and the second substrate 100. The peripheral connection contact plug PPLG may transfer signals from or to the peripheral circuit structure PS. Differently from that shown, a plurality of peripheral connection contact plugs PPLG may be provided to penetrate the mold structure THS.

The bit-line contact plugs BPLG, the cell contact plugs CPLG, and the peripheral connection contact plug PPLG may have a width in the first direction D1 or the second direction D2 that increases in the third direction D3. The bit-line contact plugs BPLG, the cell contact plugs CPLG, and the peripheral connection contact plug PPLG may include a conductive material, such as metal.

The third upper dielectric layer 270 may be provided thereon with a bit line BL, first conductive lines CL1, and a second conductive line CL2. The bit line BL may extend in the second direction D2 on the cell array region CAR. The bit line BL may be connected through the bit-line contact plugs BPLG to the vertical structures VS. The first and second conductive lines CL1 and CL2 may be provided on the extension region EXR. The first conductive lines CL1 may each be connected through one of the cell contact plugs CPLG to one of the gate electrodes ELa and ELb. The second conductive line CL2 may be connected through the peripheral connection contact plug PPLG to the peripheral circuit structure PS.

A fourth upper dielectric layer 290 may be provided to cover the first and second conductive lines CL1 and CL2, the bit line BL, and a top surface of the third upper dielectric layer 270. The fourth upper dielectric layer 290 may encapsulate the bit line BL and the first and second conductive lines CL1 and CL2. The fourth upper dielectric layer 290 may include the same dielectric material as that of the first, second, and third upper dielectric layers 230, 250, and 270. Although not shown, the fourth upper dielectric layer 290 may be provided therein with additional lines and additional vias that are connected to the bit line BL and the first and second conductive lines CL1 and CL2.

The first support structures WC1 may be provided in first trenches TR1 that extend in the first direction D1 between the stack structures ST. When viewed in plan as shown in FIG. 5, the first support structures WC1 may be arranged along the second direction D2 between the stack structures ST and spaced apart from each other in the second direction D2. At least one of the first support structures WC1 may extend in the first direction D1 while running across a center of one of the stack structures ST. The first support structures WC1 may be provided between the pad portions ELp of the stack structures ST. The first support structures WC1 may not be in contact with the vertical structures VS while being spaced apart in the second direction D2 from the vertical structures VS.

When viewed in cross-section as shown in FIG. 6, the first support structures WC1 may each extend in the third direction D3 while penetrating the first and second upper dielectric layers 230 and 250, the stack structures ST, and at least a portion of the source structure SC. Each of the first support structures WC1 may have a bottom surface at a level between that of a top surface of the source structure (e.g., a bottom surface of a lowermost one of the first interlayer dielectric layers ILDa) and that of a bottom surface of each of the vertical structures VS.

For example, the first support structures WC1 may completely penetrate the source structure SC to come into contact with the second substrate 100. For another example, the first support structures WC1 may penetrate the second source conductive pattern SCP2 and a portion of the first source conductive patterns SCP1, and each of the first support structures WC1 may have a lower portion surrounded in a plan view by the first source conductive pattern SCP1. In some embodiments, the first source conductive pattern SCP1 may extend between the second substrate 100 and the first support structures WC1. For another example, the first support structures WC1 may penetrate only a portion of the second source conductive pattern SCP2, and each of the first support structures WC1 may have a lower portion surrounded in a plan view by the second source conductive pattern SCP2. In some embodiments, the second source conductive pattern SCP2 may extend between the first source conductive pattern SCP1 and the first support structures WC1. The level of the bottom surface of each first support structure WC1 may be changed based on fabrication sequence and/or method.

The first support structures WC1 may separate the stack structures ST and the first upper dielectric layer 230 from each other. When viewed in plan as shown in FIG. 5, the second upper dielectric layer 250 may be connected through a connection support structure CCS. The connection support structure CCS may be a portion of the second upper dielectric layer 250. The top surface of each of the first support structures WC1 may be located at a level higher with respect to the second substrate 100 than that of each of the vertical structures VS, and may be substantially coplanar with that of the second upper dielectric layer 250.

Each of the first support structures WC1 may include a first spacer part SP1 and a first filler part FL1. The first spacer part SP1 may cover or overlap the sidewalls of the gate electrodes ELa and ELb included in the stack structures ST, and may also cover or overlap the sidewalls of the interlayer dielectric layers ILDa and ILDb included in the stack structures ST. The first filler part FL1 may completely fill an empty space surrounded by the first spacer part SP1.

The first spacer part SP1 may include first protrusions PP1 that protrude toward the gate electrode ELa and ELb between the interlayer dielectric layers ILDa and ILDb. Each of the first protrusions PP1 may overlap in the third direction D3 with portions of the interlayer dielectric layers ILDa and ILDb. Each of the first protrusions PP1 may have a thickness substantially the same as that of each of the gate electrodes ELa and ELb. The first support structures WC1 may use the first protrusions PP1 to rigidly support the gate electrodes ELa and ELb and the interlayer dielectric layers ILDa and ILDb of the stack structures ST.

The first spacer part SP1 and the first filler part FL1 may include, for example, silicon oxide. For example, the first spacer part SP1 may include silicon oxide formed by atomic layer deposition (ALD), and the first filler part FL1 may include silicon oxide formed by chemical vapor deposition (CVD).

The second support structures WC2 may be provided in second trenches TR2 that extend in the second direction D2 between the first support structures WC1 on the extension region EXR. When viewed in plan as shown in FIG. 5, the second support structures WC2 may be arranged along the first and second directions D1 and D2 and spaced apart from each other in the first and second directions D1 and D2. The second support structures WC2 may not be in contact with the cell contact plugs CPLG while being spaced apart in the first direction D1 from the cell contact plugs CPLG. The first and second support structures WC1 and WC2 may not be in contact with each other while being spaced apart from each other in the second direction D2.

Each of the second support structures WC2 may have a first width W1 defined as a length that extends in the first direction D1 and a second width W2 defined as a length that extends in the second direction D2. For example, when a distance between the first support structures WC1 is in a range of about 500 nm to about 700 nm, the first width W1 may range from about 100 nm to about 200 nm, and the second width W2 may range from about 300 nm to about 400 nm. The present inventive concepts, however, are not limited thereto, and the first width W1 and the second width W2 may be changed based on a distance between the first support structures WC1.

A first distance G1 may be defined to refer to an interval between the second support structures WC2 that are adjacent to each other across the cell contact plugs CPLG. A second distance G2 may be defined to refer to an interval between one of the second support structures WC2 and its adjacent one of the first support structures WC1. For example, the first distance G1 may range from about 230 nm to about 330 nm, and the second distance G2 may range from about 50 nm to about 200 nm. The second distance G2 may be, for example, about 100 nm to about 150 nm.

As the first distance G1 is securely obtained, the second support structures WC2 may be minimized or prevented from being connected to the cell contact plugs CPLG. As the second distance G2 is securely obtained, the second support structures WC2 may be minimized or prevented from being connected to the first support structures WC1. The present inventive concepts, however, are not limited thereto, and the first distance G1 and the second distance G2 may be changed depending on an area of a top surface of each of the pad portions ELp and the cell contact plugs CPLG.

The third support structure WC3 may be provided in a third trench TR3 that surrounds the mold structure THS in a plan view on the extension region EXR. When viewed in plan as shown in FIG. 5, the third support structure WC3 may completely surround the mold structure THS and extend in the first and second directions D1 and D2. The mold structure THS may be electrically separated from the stack structures ST across the third support structure WC3.

The third support structure WC3 may be in contact with neither the first support structures WC1 nor the second support structures WC2 and is spaced apart from the first support structures WC1 and the second support structures WC2. In addition, the third support structure WC3 may be spaced apart from and may not be in contact with the peripheral connection contact plug PPLG that penetrates the mold structure THS.

When viewed in cross-section as shown in FIG. 6, each of the second and third support structures WC2 and WC3 may penetrate the first upper dielectric layer 230, the stack structures ST, and at least a portion of the source structure SC, while extending in the third direction D3. The second support structures WC2 may penetrate the pad portions ELp of the stack structures ST. For example, two second support structures WC2 may penetrate corresponding pad portions ELp. The second and third support structures WC2 and WC3 may have their bottom surfaces at a level between that of the top surface of the source structure (e.g., the bottom surface of the lowermost one of the first interlayer dielectric layers ILDa) and that of the bottom surface of each of the vertical structures VS.

For example, the bottom surface of each of the second and third support structures WC2 and WC3 may be located at a level substantially the same as that of the bottom surface of each first support structure WC1. The level of the bottom surface of each of the second and third support structures WC2 and WC3 may be changed based on fabrication sequence and/or method. In some embodiments, differently from that shown, the bottom surface of each of the second and third support structures WC2 and WC3 may be located at a level higher than that of a top surface of the second substrate 100 and that of the bottom surface of each first support structure WC1.

The top surface of each of the second and third support structures WC2 and WC3 may be located at a level between that of the top surface of each vertical structure VS and that of the top surface of each first support structure WC1. The top surface of each of the second and third support structures WC2 and WC3 may be substantially coplanar with the top surface of the first upper dielectric layer 230.

When viewed in cross-section as shown in FIG. 6, the second and third support structures WC2 and WC3 may have substantially the same cross-sectional structure. Each of the second and third support structures WC2 and WC3 may include a second spacer part SP2 and a second filler part FL2. The second spacer part SP2 may cover or overlap the sidewalls of the gate electrodes ELa and ELb included in the stack structures ST (or the sidewalls of the sacrificial layers 130 of the mold structure THS in the case of the third support structure WC3), and may also cover or overlap the sidewalls of the interlayer dielectric layers ILDa and ILDb included in the stack structures ST. The second filler part FL2 may fill a space surrounded by the second spacer part SP2.

For example, the second filler part FL2 may not completely fill the space surrounded by the second spacer part SP2. In this case, the second filler part FL2 may include a seam FL2*s* therein. The seam FL2*s* may be defined to refer to an empty space in the second filler part FL2. In other words, the seam FL2*s* is void of a material of the second filler part FL2. The seam FL2*s* present in the second filler part FL2 may minimize or prevent the second and third support structures WC2 and WC3 from being deformed or cracked due to stress of the second filler part FL2.

The second spacer part SP2 may have a multi-layered or single-layered structure as discussed below with reference to FIGS. 7A and 7B. The second spacer part SP2 may include, for example, one or more of silicon oxide and silicon nitride. The second filler part FL2 may include, for example, polysilicon or silicon oxide. This, however, is merely an example, and the present inventive concepts are not limited to the example mentioned above.

Each of the first, second, and third support structures WC1, WC2, and WC3 may have a width in the first direction D1 or the second direction D2 that increases in the third direction D3. The first, second, and third support structures WC1, WC2, and WC3 may support the stack structures ST, the vertical structures VS on the cell array region CAR, and the mold structure THS on the extension region EXR, and thus it may be possible to prevent collapse of the stack structures ST, the vertical structures VS, and the mold structure THS. The collapse may be minimized or prevented to allow a three-dimensional semiconductor memory device to have improved stability and/or electrical properties.

Figure 7A:
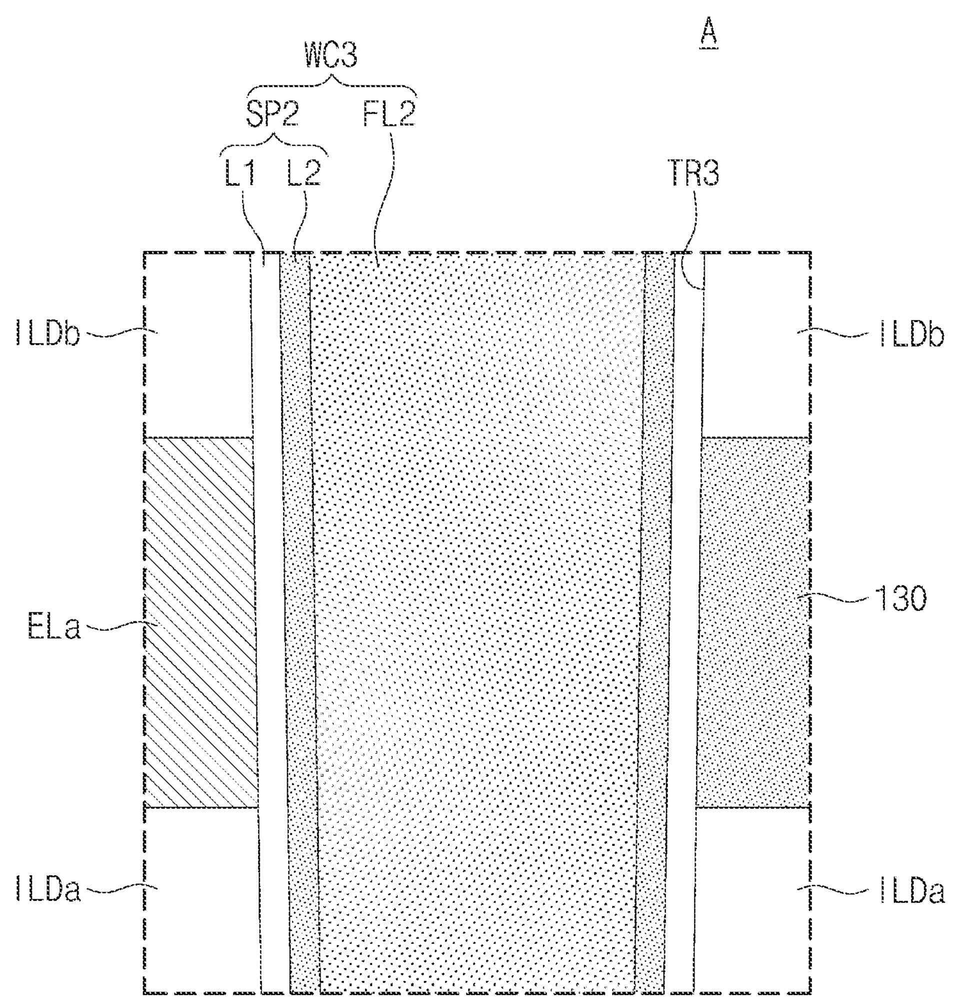
FIGS. 7A and 7B illustrate enlarged views of section A depicted in FIG. 6, partially showing a three-dimensional semiconductor memory device according to some example embodiments of the present inventive concepts.
Figure 7B:
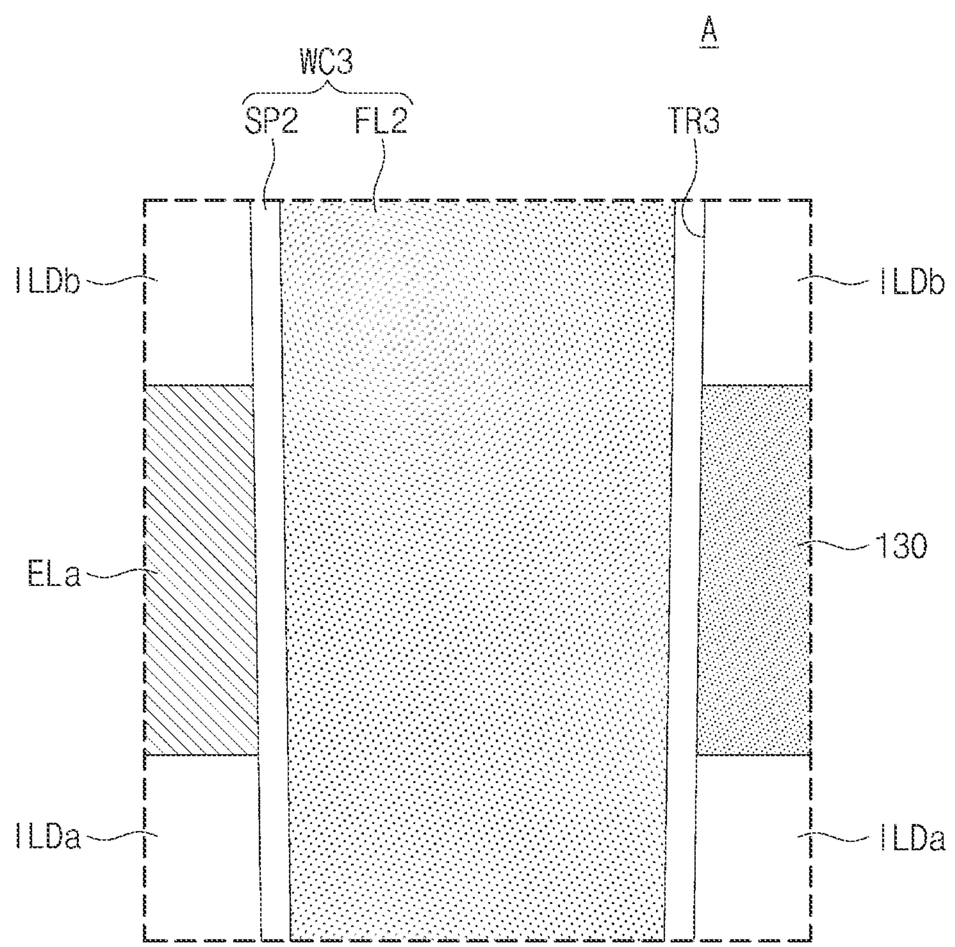

FIGS. 7A and 7B illustrate enlarged views of section A depicted in FIG. 6, partially showing a three-dimensional semiconductor memory device according to some example embodiments of the present inventive concepts. FIGS. 7A and 7B explain a portion of the third support structure WC3, but this explanation will also be applicable to the second support structures WC2.

Referring to FIGS. 6 and 7A, the second spacer part SP2 of the third support structure WC3 may have a multi-layered structure that includes a first layer L1 and a second layer L2. The first layer L1 may cover or overlap the sidewalls of the interlayer dielectric layers ILDa and ILDb and the gate electrodes ELa and ELb included in the stack structures ST. The first layer L1 of the second spacer part SP2 that is not in contact with the stack structures ST may cover the sidewalls of the interlayer dielectric layers ILDa and ILDb and the sacrificial layers 130 included in the mold structures THS.

The second layer L2 may be provided between the first layer L1 and the second filler part FL2. The second layer L2 may conformally cover the first layer L1. The second filler part FL2 may fill a space surrounded by the second layer L2.

For example, the first layer L1, the second layer L2, and the second filler part FL2 may respectively include silicon oxide, silicon nitride, and polysilicon. For another example, the first layer L1, the second layer L2, and the second filler part FL2 may respectively include silicon oxide, silicon nitride, and silicon oxide.

Although not shown, an additional silicon nitride layer may be provided on an upper portion of each of the second and third support structures WC2 and WC3. The additional silicon nitride layer may lie between the second layer L2 and the second filler part FL2 and cover a portion of the second layer L2.

Referring to FIGS. 6 and 7B, the second spacer part SP2 of the third support structure WC3 may have a single-layered structure. The second spacer part SP2 may include, for example, silicon oxide. The second filler part FL2 may include, for example, polysilicon. Alternatively, the second filler part FL2 may include silicon oxide, and an indistinct boundary may be provided between the second filler part FL2 and the second spacer part SP2.

Figure 8:
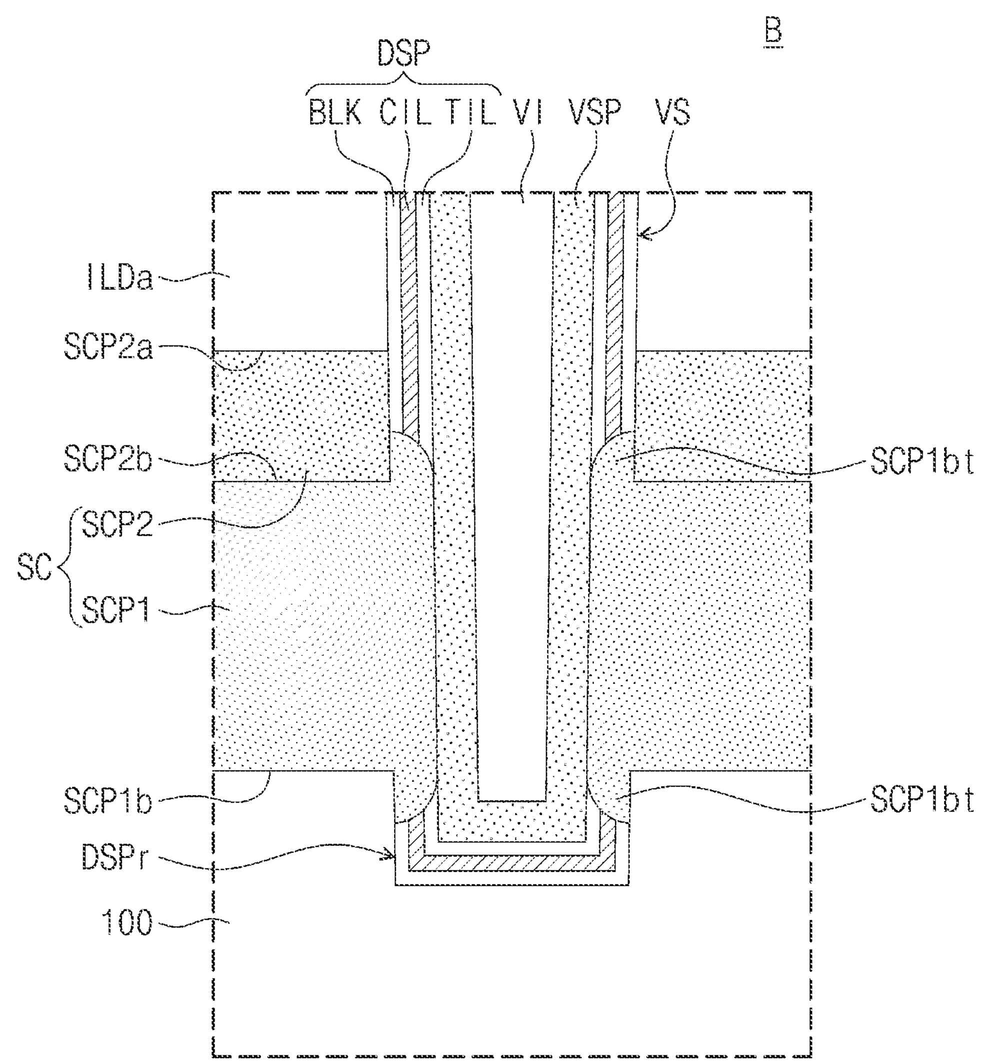
FIG. 8 illustrates an enlarged view of section B depicted in FIG. 6, partially showing a three-dimensional semiconductor memory device according to some example embodiments of the present inventive concepts.

FIG. 8 illustrates an enlarged view of section B depicted in FIG. 6, partially showing a three-dimensional semiconductor memory device according to some example embodiments of the present inventive concepts.

FIGS. 6 and 8 depict the source structure SC including the first and second source conductive patterns SCP1 and SCP2, and also depict one of the vertical structures VS each including the data storage pattern DSP, the vertical semiconductor pattern VSP, the buried dielectric pattern VI, and a lower data storage pattern DSPr. For convenience of description, the following will explain a single stack structure ST and a single vertical structure VS, and this explanation will also be applicable to other vertical structures VS that penetrate other stack structures ST.

The data storage pattern DSP may include a blocking dielectric layer BLK, a charge storage layer CIL, and a tunneling dielectric layer TIL that are sequentially stacked. The blocking dielectric layer BLK may be adjacent to the stack structure ST or the source structure SC, and the tunneling dielectric layer TIL may be adjacent to the vertical semiconductor pattern VSP. The charge storage layer CIL may be interposed between the blocking dielectric layer BLK and the tunneling dielectric layer TIL. The blocking dielectric layer BLK, the charge storage layer CIL, and the tunneling dielectric layer TIL may extend in the third direction D3 between the stack structure ST and the vertical semiconductor pattern VSP. The data storage pattern DSP may store and/or change data by using Fowler-Nordheim tunneling induced by a voltage difference between the vertical semiconductor pattern VSP and the gate electrodes ELa and ELb. For example, the blocking dielectric layer BLK and the tunneling dielectric layer TIL may include silicon oxide, and the charge storage layer CIL may include silicon nitride or silicon oxynitride.

The first source conductive pattern SCP1 of the source structure SC may be in contact with the vertical semiconductor pattern VSP, and the second source conductive pattern SCP2 of the source structure SC may be spaced apart from the vertical semiconductor pattern VSP across the data storage pattern DSP. The first source conductive pattern SCP1 may be spaced apart from the buried dielectric pattern VI across the vertical semiconductor pattern VSP.

For example, the first source conductive pattern SCP1 may include protrusions SCP1*bt* located at a level higher than that of a bottom surface SCP2*b* of the second source conductive pattern SCP2 or lower than that of a bottom surface SCP1*b* of the first source conductive pattern SCP1. The protrusions SCP1*bt* may be located at a level lower than that of a top surface SCP2*a* of the second source conductive pattern SCP2. The protrusions SCP1*bt* may each have, for example, a curved shape at a surface in contact with the data storage pattern DSP or the lower data storage pattern DSPr.

Figure 9:
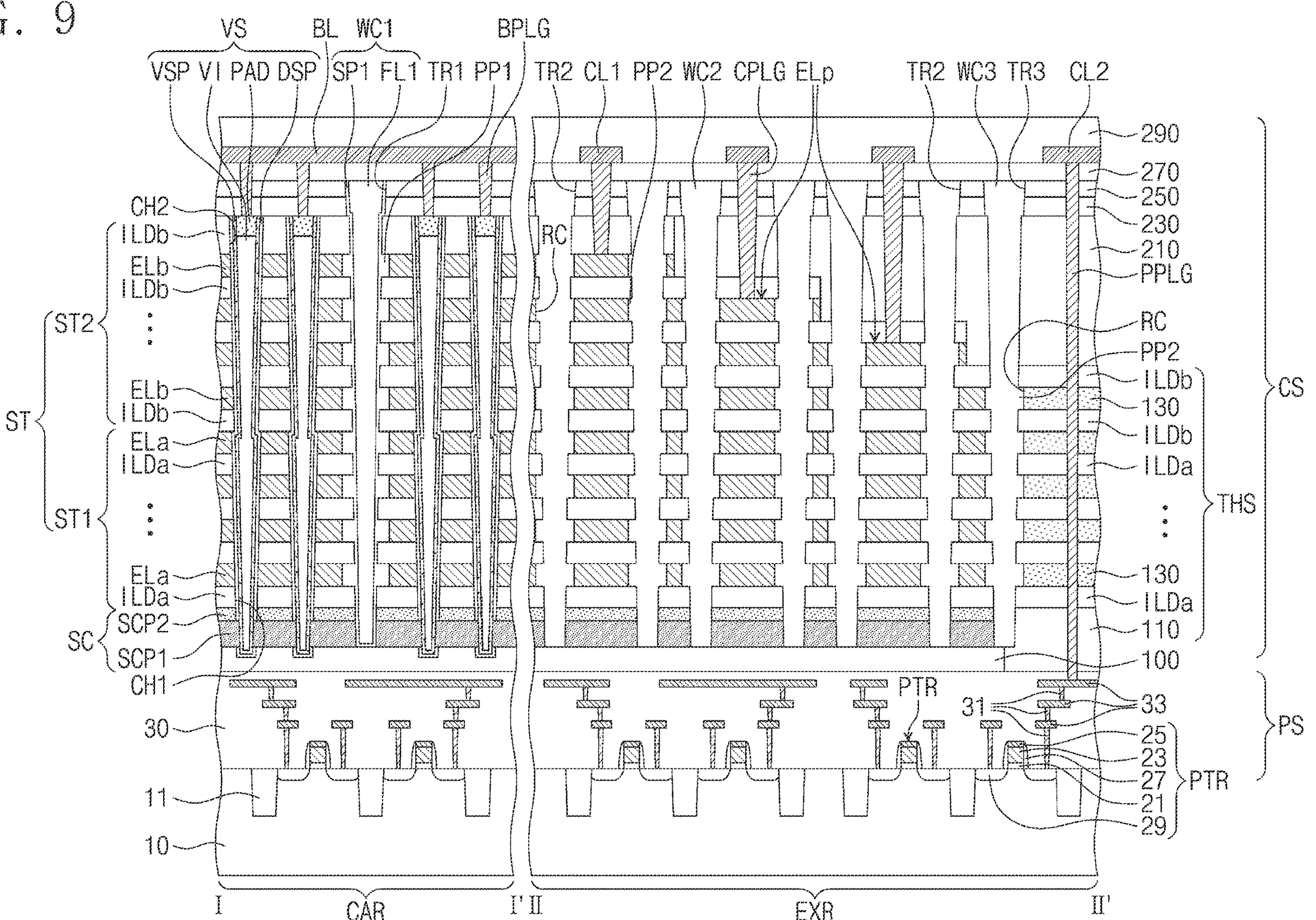

FIG. 9 illustrates a cross-sectional view taken along lines I-I' and II-II' of FIG. 5, showing a three-dimensional semiconductor memory device according to some example embodiments of the present inventive concepts. For convenience of description, omission will be made to avoid substantially the same description as that in the embodiment discussed with reference to FIGS. 5 and 6.

Referring to FIGS. 5 and 9, each of the second and third support structures WC2 and WC3 may extend in the third direction D3 while penetrating the first and second upper dielectric layers 230 and 250, the stack structures ST, and at least a portion of the source structure SC.

Each of the second and third support structures WC2 and WC3 may have a top surface at a higher level than that of the top surface of each of the vertical structures VS. The top surface of each of the second and third support structures WC2 and WC3 may be located at substantially the same level as that of the top surface of each first support structure WC1, and may be substantially coplanar with that of the second upper dielectric layer 250.

Each of the second and third support structures WC2 and WC3 may include second protrusions PP2 that protrude toward either the gate electrodes ELa and ELb or the sacrificial layers 130 between the interlayer dielectric layers ILDa and ILDb. The second protrusions PP2 may be provided in recessions RC where the gate electrodes ELa and ELb or the sacrificial layers 130 are recessed in the first direction D1 or in a direction opposite to the first direction D1. Each of the second protrusions PP2 may overlap in the third direction D3 with portions of the interlayer dielectric layers ILDa and ILDb. Each of the second protrusions PP2 may have a thickness substantially the same as that of each of the gate electrodes ELa and ELb and that of each of the sacrificial layers 130. The second and third support structures WC2 and WC3 may use the second protrusions PP2 to rigidly support the gate electrodes ELa and ELb, the interlayer dielectric layers ILDa and ILDb, and the sacrificial layers 130.

The second and third support structures WC2 and WC3 may have substantially the same cross-sectional structure. For example, the second and third trenches TR2 and TR3 may be filled with silicon oxide without spacer deposition, and may thus include only silicon oxide. Because the second and third support structures WC2 and WC3 include only silicon oxide, an interaction may be reduced between the cell contact plugs CPLG and the second and third support structures WC2 and WC3, and accordingly a three-dimensional semiconductor memory device may improve in stability and/or electrical properties.

FIGS. 10 to 21 illustrate cross-sectional views showing a method of fabricating a three-dimensional semiconductor memory device according to some example embodiments of the present inventive concepts. The following will discuss in detail three-dimensional semiconductor memory devices and methods of fabricating the same according to some example embodiments of the present inventive concepts in conjunction with the accompanying drawings. First, with reference to FIGS. 10 to 19, it will be discussed a method of fabricating the three-dimensional semiconductor memory device according to the embodiment of FIG. 6.

Figure 10:
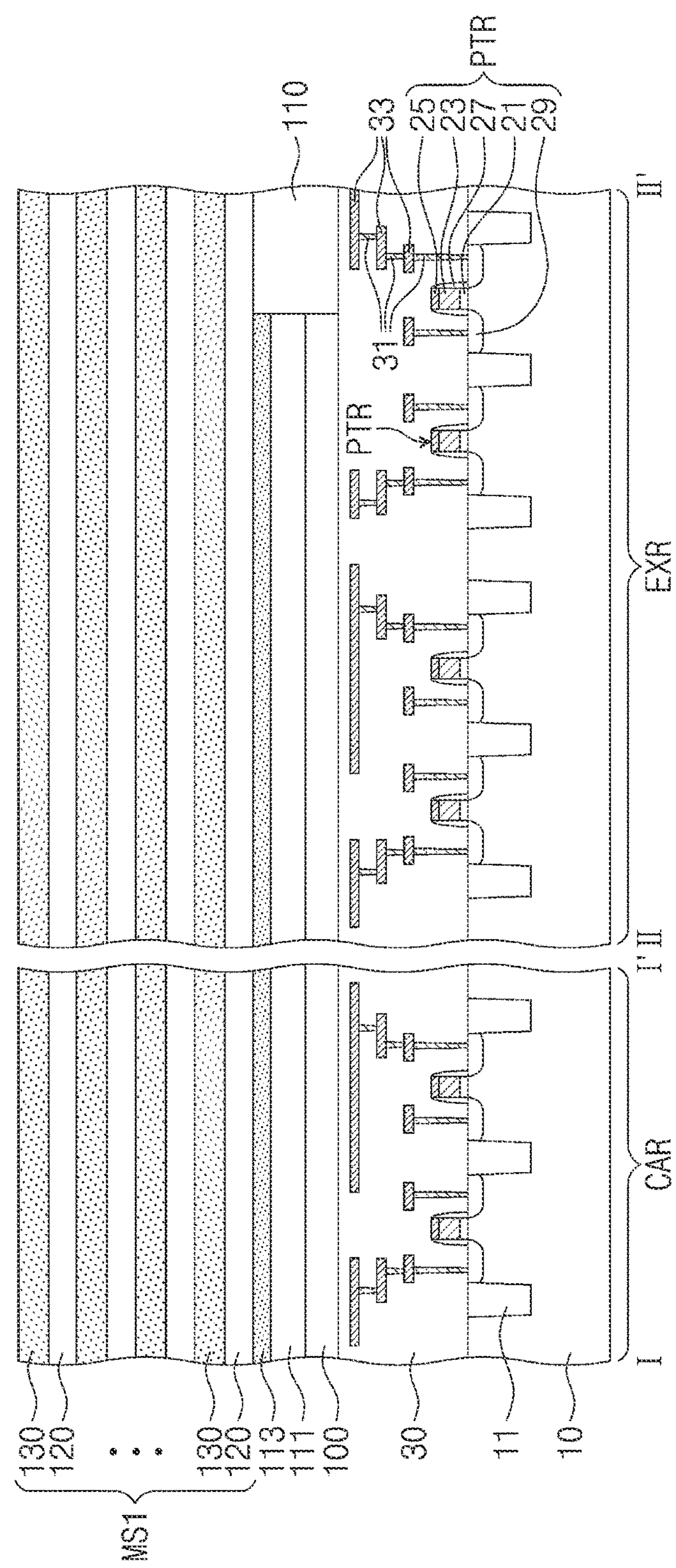
FIGS. 10 to 21 illustrate cross-sectional views showing a method of fabricating a three-dimensional semiconductor memory device according to some example embodiments of the present inventive concepts.

Referring to FIG. 10, a first substrate 10 may be provided which includes a cell array region CAR and an extension region EXR. A device isolation layer 11 may be formed to define active regions on the first substrate 10. The device isolation layer 11 may be formed by forming a trench on an upper portion of the first substrate 10 and at least partially filling the trench with silicon oxide.

Peripheral transistors PTR may be formed on the active region defined by the device isolation layer 11. Peripheral contact plugs 31 and peripheral circuit lines 33 may be formed to have connection with peripheral source/drain regions 29 of the peripheral transistors PTR. A peripheral circuit dielectric layer 30 may be formed to cover or overlap the peripheral transistors PTR, the peripheral contact plugs 31, and the peripheral circuit lines 33.

A second substrate 100 and a lower dielectric pattern 110 may be formed on the peripheral circuit dielectric layer 30. A lower sacrificial layer 111 and a lower semiconductor layer 113 may be formed on the second substrate 100. The lower dielectric pattern 110 may be formed by forming a second substrate 100, a lower sacrificial layer 111, and a lower semiconductor layer 113 on an entire surface of the peripheral circuit dielectric layer 30, partially patterning the second substrate 100, the lower sacrificial layer 111, and the lower semiconductor layer 113, and then filling the patterned portion with a dielectric material. An additional planarization process may be performed such that the lower semiconductor layer 113 and the lower dielectric pattern 110 may have their top surfaces that are substantially coplanar with each other. In this description, the phrase "be substantially coplanar with" may mean that an additional planarization process may be performed. The planarization process may include, for example, a chemical mechanical polishing (CMP) process or an etch-back process.

A first film structure MS1 may be formed to include interlayer dielectric layers 120 and sacrificial layers 130 that are alternately stacked on the lower semiconductor layer 113 and the lower dielectric pattern 110. The sacrificial layers 130 may be formed of a material that can be etched with an etch selectivity with respect to the interlayer dielectric layers 120. For example, the sacrificial layers 130 may be formed of a dielectric material different from that of the interlayer dielectric layers 120. For example, the sacrificial layers 130 may be formed of silicon nitride, and the interlayer dielectric layers 120 may be formed of silicon oxide. The sacrificial layers 130 may have substantially the same thickness, and the interlayer dielectric layers 120 may have different thicknesses depending on their positions.

Figure 11:
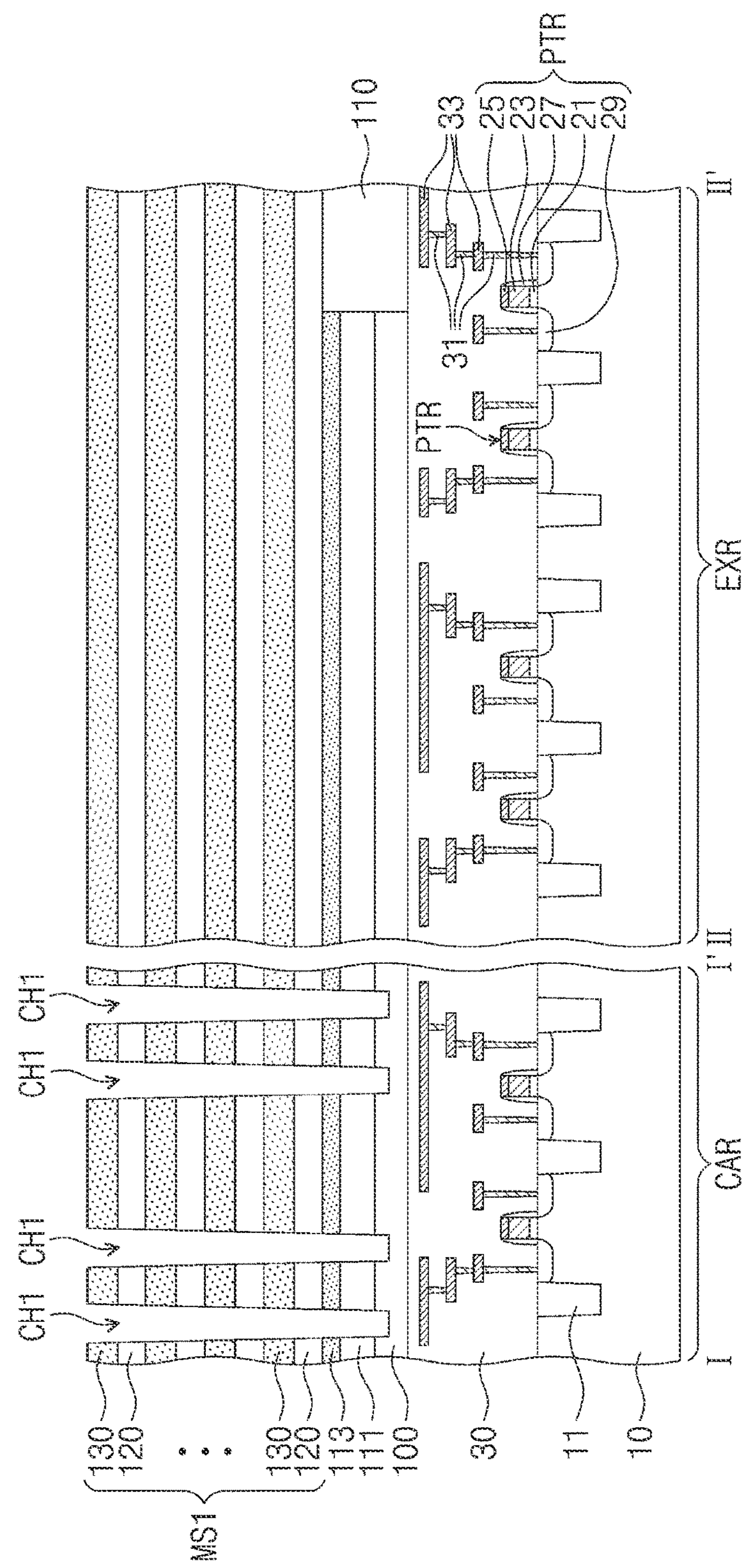

Referring to FIG. 11, on the cell array region CAR, first vertical channels CH1 may be formed to penetrate in a third direction D3 through the interlayer dielectric layers 120 and the sacrificial layers 130 of the first film structure MS1, the lower sacrificial layer 111, the lower semiconductor layer 113, and at least a portion of the second substrate 100. The first vertical channels CH1 may expose sidewalls of the interlayer dielectric layers 120, of the sacrificial layers 130, of the lower sacrificial layer 111, and of the lower semiconductor layer 113, and may also partially expose a top surface of the second substrate 100.

Figure 12:
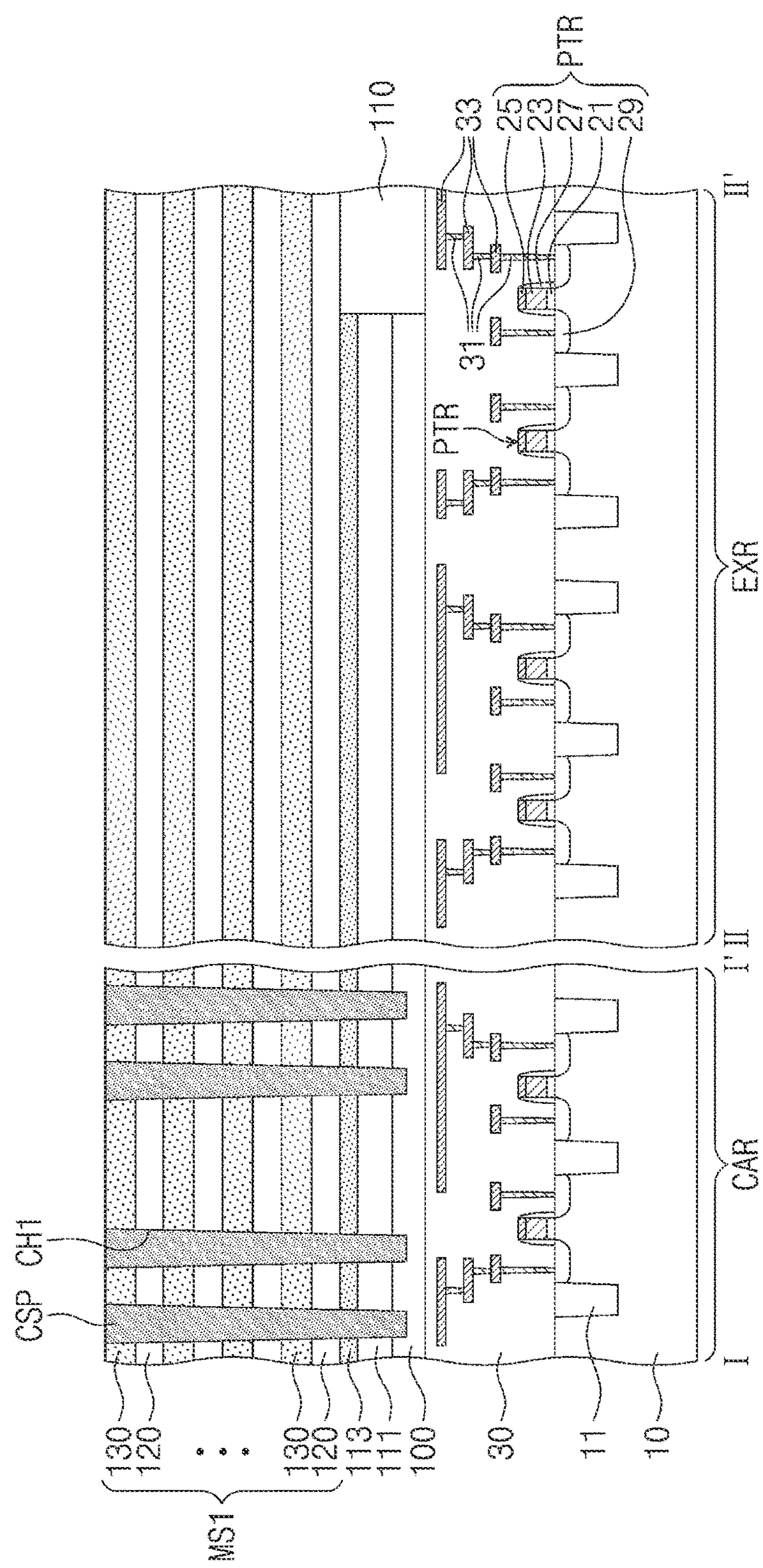

Referring to FIG. 12, channel sacrificial patterns CSP may be formed in the first vertical channels CH1. The channel sacrificial patterns CSP may completely fill the first vertical channels CH1, and each of the channel sacrificial patterns CSP may have a top surface substantially the same as that of the first film structure MS1.

Figure 13:
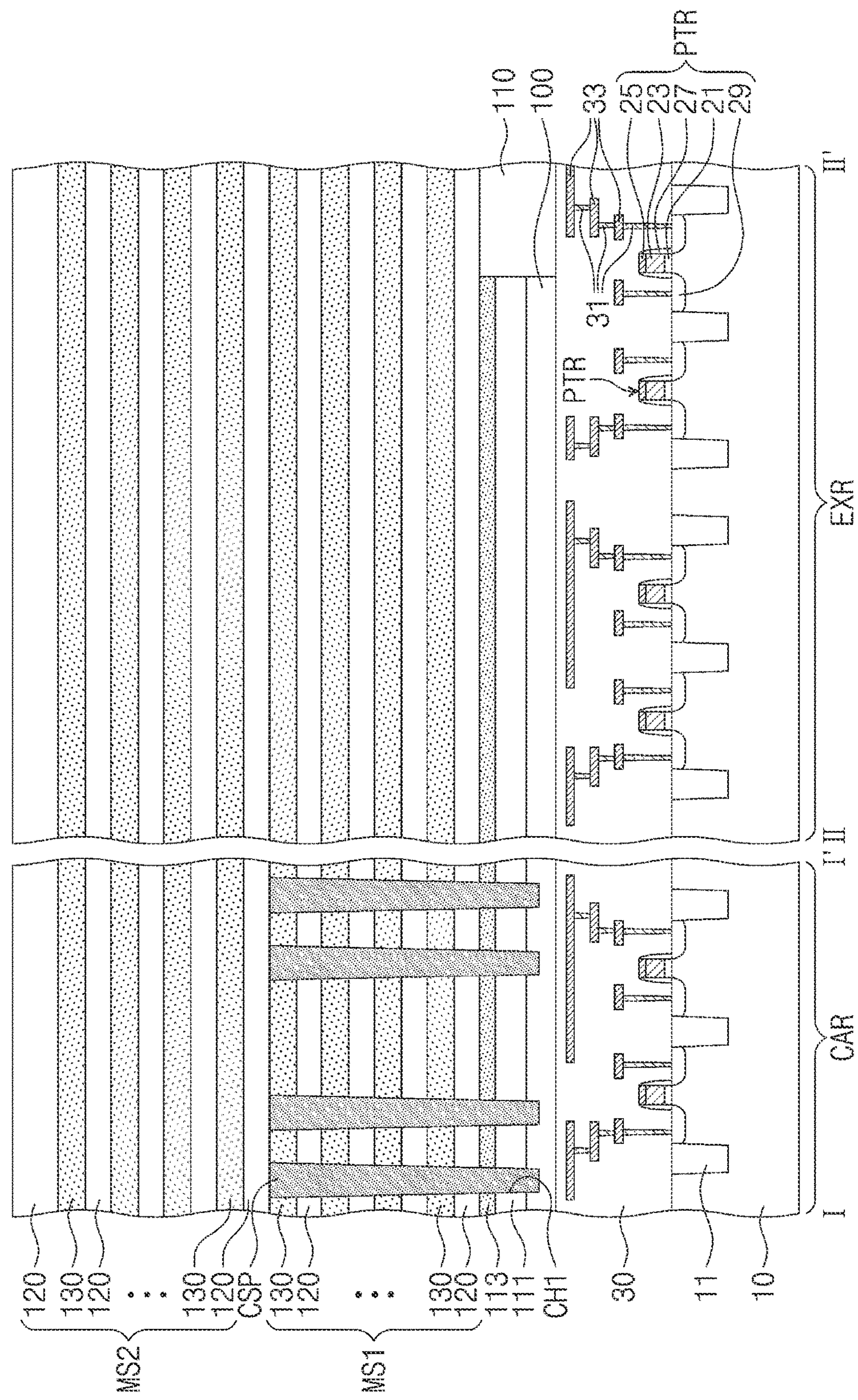

Referring to FIG. 13, a second film structure MS2 may be formed to include interlayer dielectric layers 120 and sacrificial layers 130 that are alternately stacked on the first film structure MS1 and the channel sacrificial patterns CSP. Similar to the first film structure MS1, the second film structure MS2 may be configured such that the sacrificial layers 130 may have substantially the same thickness, and that the interlayer dielectric layers 120 may have different thicknesses depending on their positions. For example, the second film structure MS2 may be configured such that an uppermost one of the interlayer dielectric layers 120 may have a thickness greater than those of other interlayer dielectric layers 120.

Figure 14:
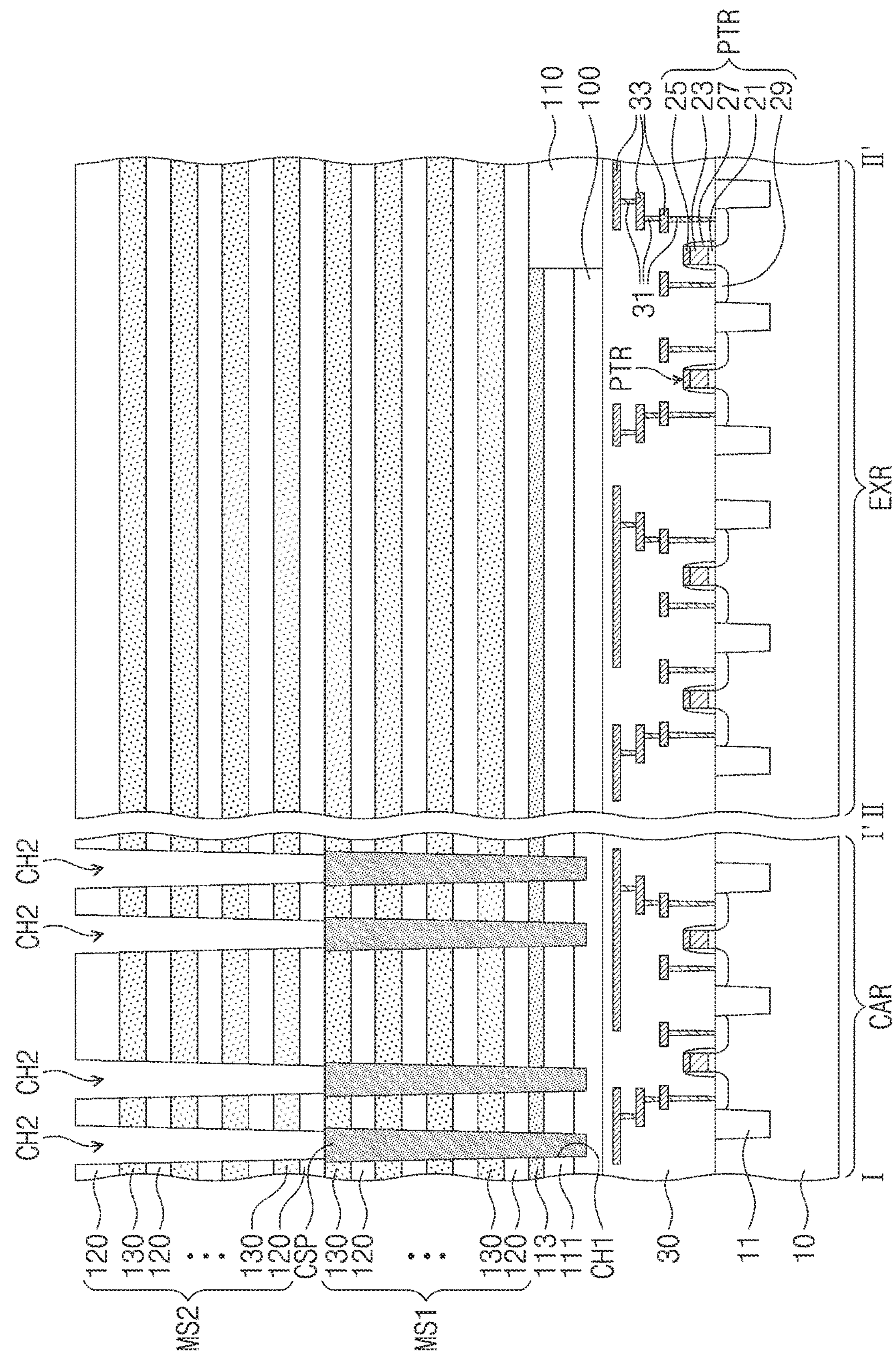

Referring to FIG. 14, on the cell array region CAR, second vertical structures CH2 may be formed to penetrate in the third direction D3 through the interlayer dielectric layers 120 and the sacrificial layers 130 included in the second film structure MS2. The second vertical channels CH2 may be aligned with the first vertical channels CH1. For example, the second vertical channels CH2 may expose the channel sacrificial patterns CSP that fill the first vertical channels CH1.

As the second film structure MS2 is immediately formed without performing on the first film structure MS1 a trimming process, which will be discussed below, an unnecessarily thick layer may not be provided on the first film structure MS1 and misalignment may be minimized or prevented between the first vertical channels CH1 and the second vertical channels CH2, which may result in simplification of fabrication processes and/or improvement of electrical properties.

Figure 15:
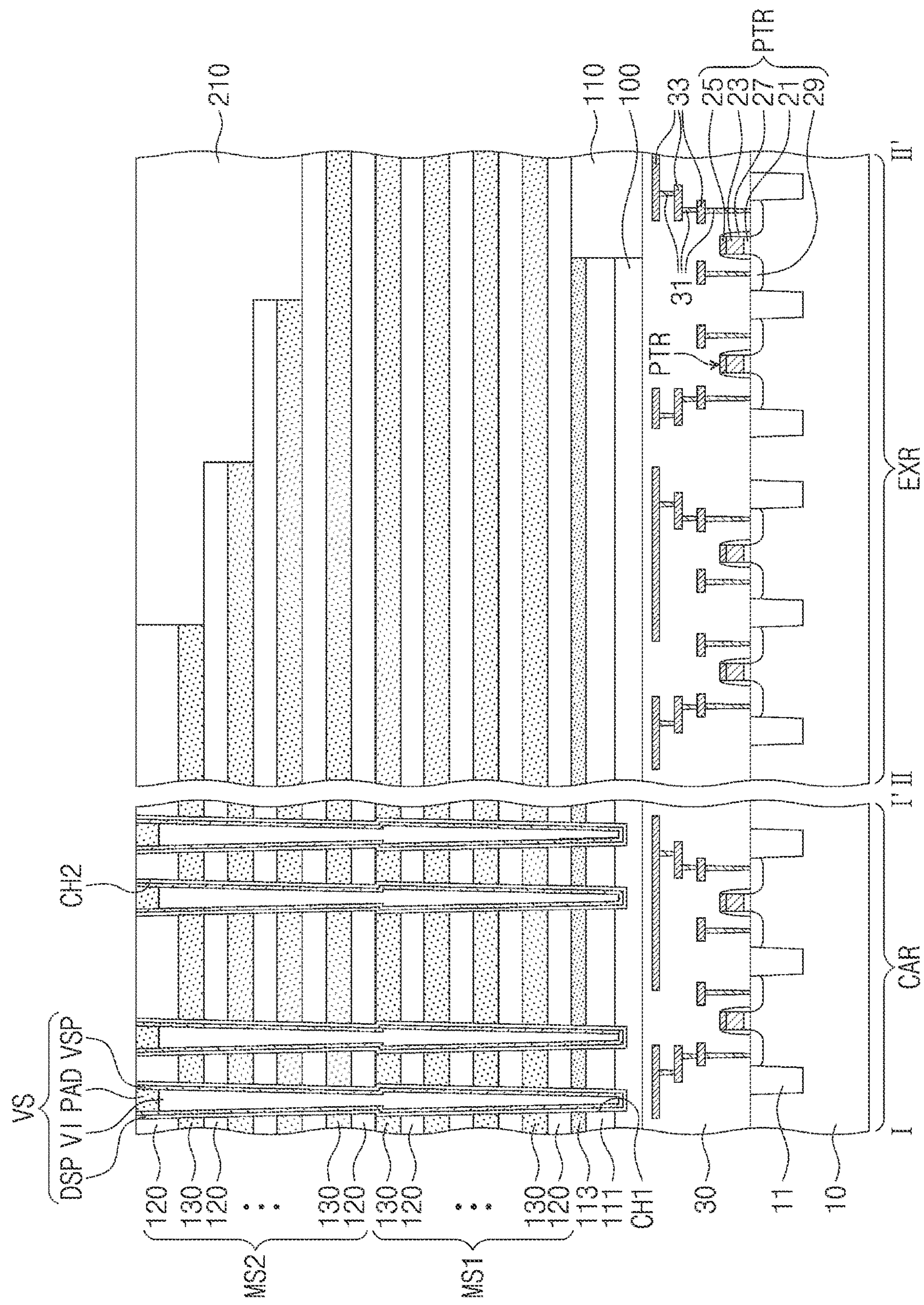

Referring to FIG. 15, the channel sacrificial patterns CSP which are exposed through the second vertical channels CH2 may be removed. Vertical channels VS may be formed in spaces from which the channel sacrificial patterns CSP are removed. Each of the vertical structures VS may be formed by forming a data storage pattern DSP and a vertical semiconductor pattern VSP that conformally cover or overlap sidewalls of the first and second vertical channels CH1 and CH2, and then forming a buried dielectric pattern VI and a conductive pad PAD in a space surrounded by the vertical semiconductor pattern VSP. The vertical structures VS may be formed only on the cell array region CAR, but not on the extension region EXR.

A trimming process may be performed on the first and second film structures MS1 and MS2 on the extension region EXR. The trimming process may include forming a mask pattern that partially covers or overlaps a film structure on the cell array region CAR and the extension region EXR, using the mask pattern to pattern the film structure, thereby reducing an area of the mask pattern, and using the reduced mask pattern to pattern the film structure. The reducing the area of the mask pattern and the using the reduced mask pattern to pattern the film structure may be repeatedly and alternately performed. The trimming process may form a stepwise structure of the first and second film structures MS1 and MS2 on the extension region EXR.

A planarized dielectric layer 210 may be formed to cover or overlap the stepwise structure of the first and second film structures MS1 and MS2. The planarized dielectric layer 210 may have a top surface substantially coplanar with that of an uppermost one of the interlayer dielectric layers 120 included in the second film structure MS2. The planarized dielectric layer 210 may be formed of a material that can be etched with an etch selectivity with respect to the sacrificial layers 130.

Figure 16:
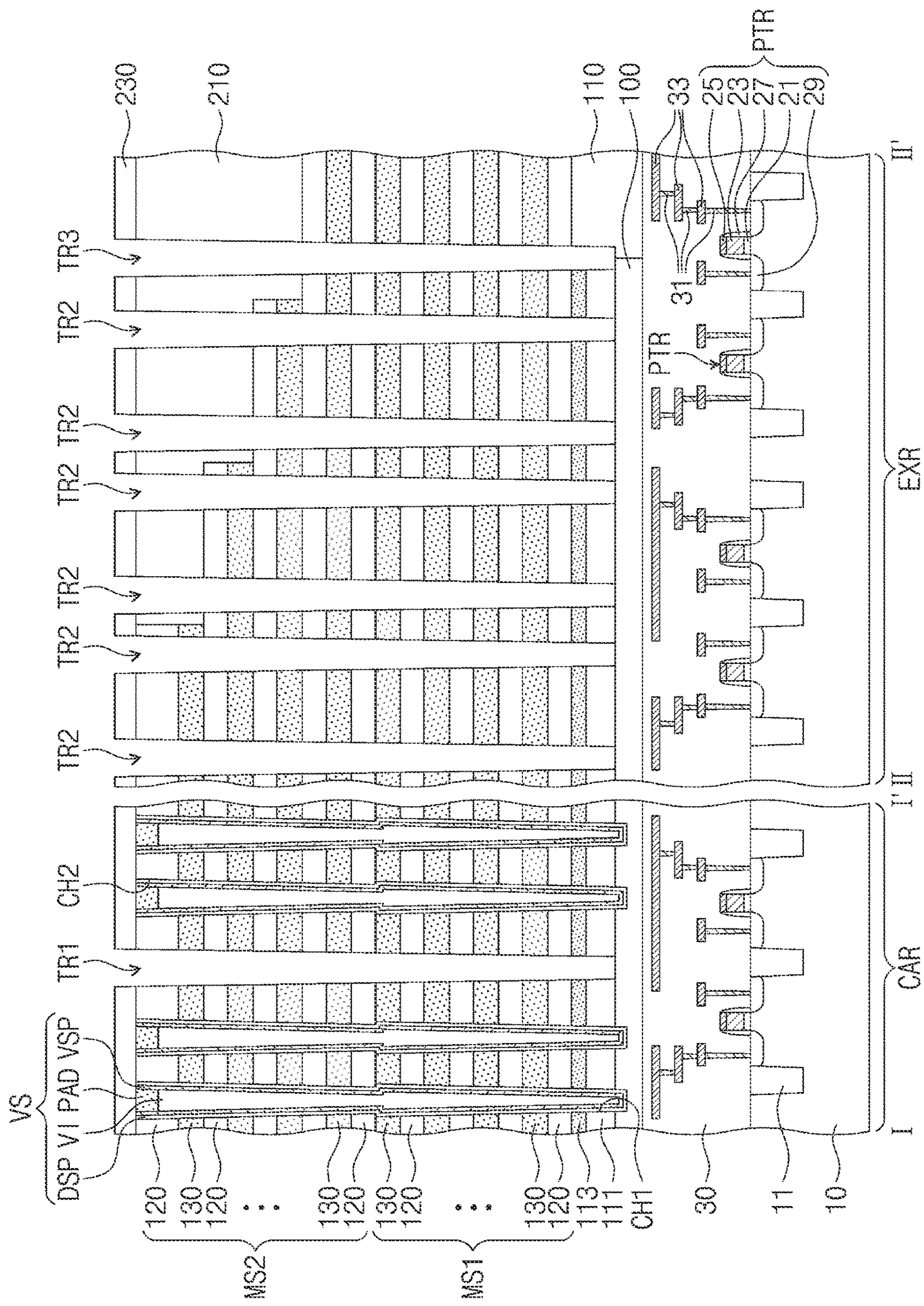

Referring to FIG. 16, a first upper dielectric layer 230 may be formed to cover or overlap a top surface of the second film structure MS2, a top surface of each of the vertical structures VS, and the top surface of the planarized dielectric layer 210. Afterwards, first trenches TR1 may be formed to penetrate the first upper dielectric layer 230, the first film structure MS1, and the second film structure MS2. On the extension region EXR, second trenches TR2 and a third trench TR3 may be formed to penetrate the first upper dielectric layer 230 and the first and second film structures MS1 and MS2.

When viewed in plan as shown in FIG. 5, the first trenches TR1 may extend in a first direction D1 while running across the first and second film structures MS1 and MS2. The first trenches TR1 may extend from the cell array region CAR toward the extension region EXR. The first trenches TR1 may be spaced apart from each other in a second direction D2. The first trenches TR1 may be spaced apart in the second direction D2 from the vertical structures VS.

The second trenches TR2 may extend in the second direction D2 between the first trenches TR1. The second trenches TR2 may be formed on the extension region EXR. The second trenches TR2 may be arranged and space apart from each other in the first and second directions D1 and D2.

The third trench TR3 may be formed on a portion of the extension region EXR. For example, the third trench TR3 may extend in the first and second directions D1 and D2 while partially surrounding the first and second film structures MS1 and MS2 on the extension region EXR. The third trench TR3 may be spaced apart from the first and second trenches TR1 and TR2.

Figure 17:
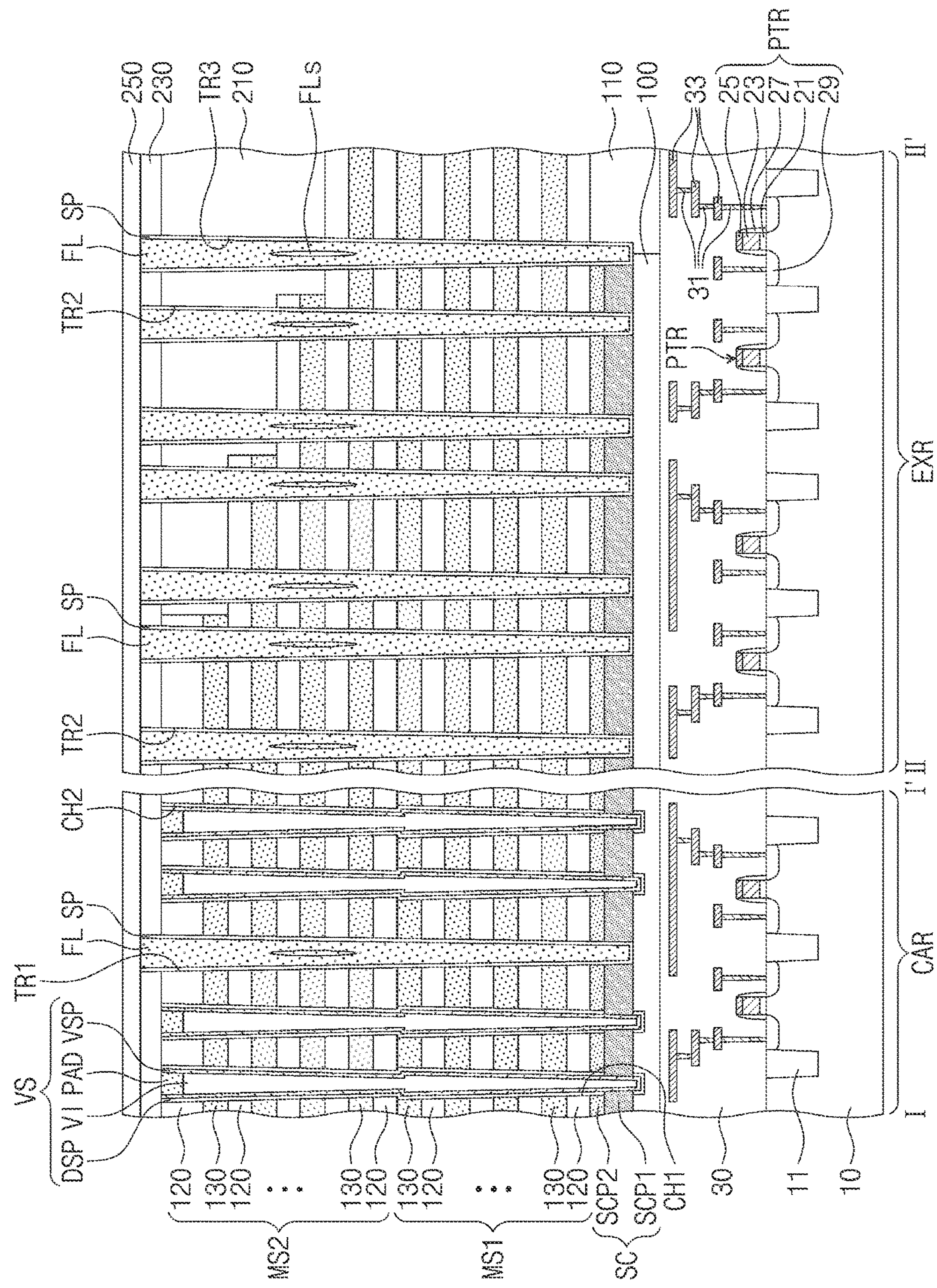

Referring to FIG. 17, a spacer part SP may be formed to conformally cover or overlap a sidewall of each of the first, second, and third trenches TR1, TR2, and TR3. A filler part FL may be formed to fill an inner space surrounded by the spacer part SP of each of the first, second, and third trenches TR1, TR2, and TR3. While the filler part FL is formed, a seam FLs may be formed in the inner space of each of the first, second, and third trenches TR1, TR2, and TR3. The spacer part SP may be formed by depositing one or more of silicon oxide and silicon nitride to have a single-layered or multi-layered structure. The filler part FL may be formed by allowing polysilicon or silicon oxide to fill the inner space surrounded by the spacer part SP.

The spacer part SP and the filler part FL of each of the first, second, and third trenches TR1, TR2, and TR3 may have their top surfaces substantially coplanar with that of the first upper dielectric layer 230. A second upper dielectric layer 250 may be formed to form the top surface of the first upper dielectric layer 230 and the top surfaces of the spacer and filler parts SP and FL of each of the first, second, and third trenches TR1, TR2, and TR3.

As the first, second, and third trenches TR1, TR2, and TR3 are formed and then filled in a state where the vertical structures VS are not formed on the extension region EXR, the first, second, and third trenches TR1, TR2, and TR3 may be occupied by first, second, and third support structures WC1, WC2, and WC3 that will be formed without their shape deformation caused by diffusion of internal materials, with the result that a three-dimensional semiconductor memory device may improve in stability and/or electrical properties. In addition, as the first, second, and third trenches TR1, TR2, and TR3 are formed after the vertical structures VS are formed in the first and second vertical channels CH1 and CH2, it may be possible to easily perform an etching process to form the first and second vertical channels CH1 and CH2 as compared to a case where the first and second vertical channels CH1 and CH2 are formed simultaneously with the first, second, and third trenches TR1, TR2, and TR3.

Figure 18:
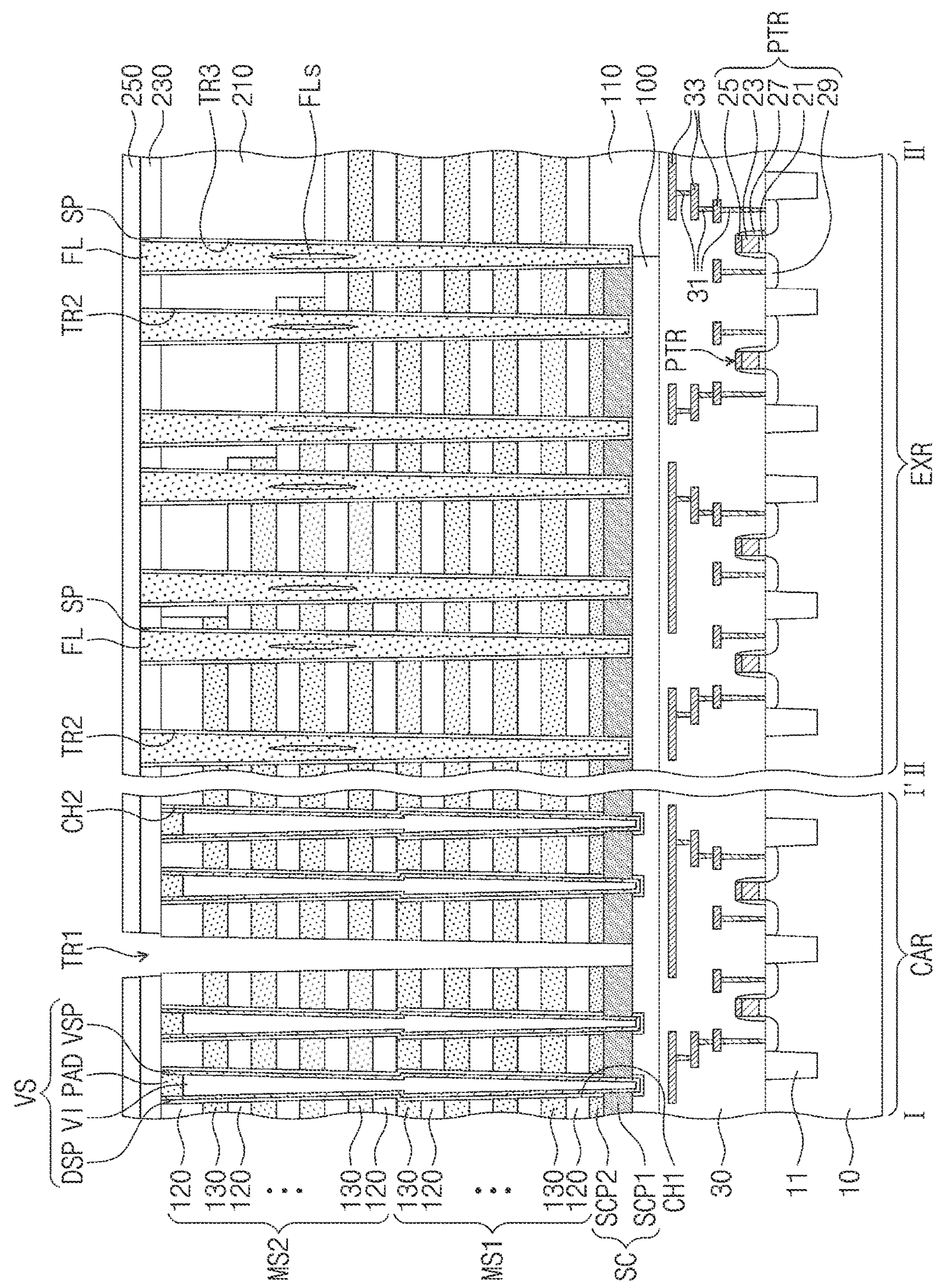

Referring to FIG. 18, the first and second upper dielectric layers 230 and 250 may be patterned on their portions that overlap the first trenches TR1. The first and second upper dielectric layers 230 and 250 may be partially patterned to expose the spacer parts SP and the filler parts FL that fill the first trenches TR1. After that, the spacer parts SP and the filler parts FL may be removed from the first trenches TR1. Therefore, the first trenches TR1 may expose again the sidewalls of the interlayer dielectric layers 120 included in the first and second film structures MS1 and MS2, the sidewalls of the sacrificial layers 130, and at least a portion of the source structure SC.

Figure 19:
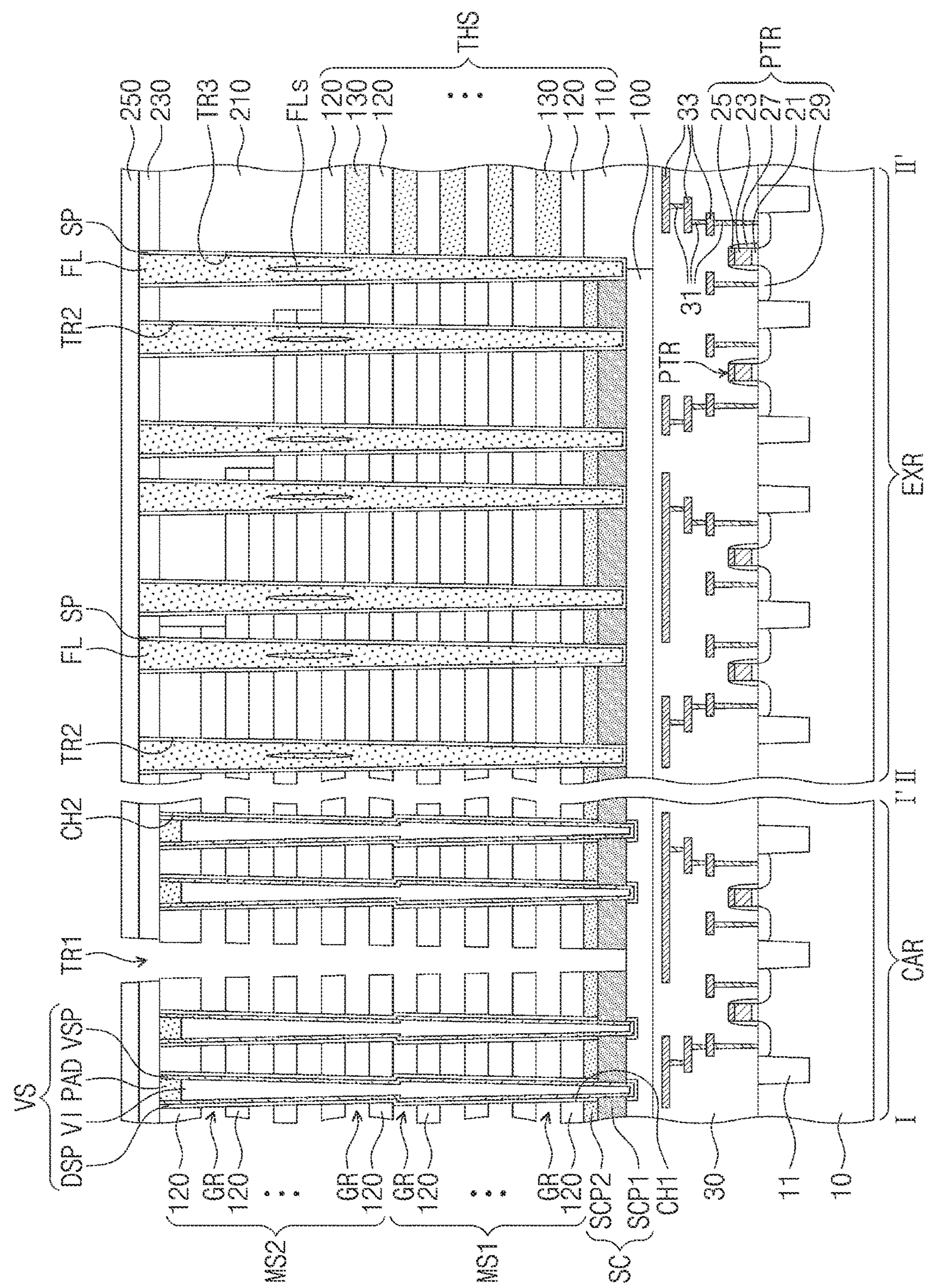

Referring to FIGS. 18 and 19, a selective removal may be performed on the sacrificial layers 130 of the first and second film structures MS1 and MS2, which sacrificial layers 130 are exposed to the first trenches TR1. For example, the selective removal of the sacrificial layers 130 may be performed by a wet etching process that uses an etchant including hydrofluoric acid or phosphoric acid. The selective removal of the sacrificial layers 130 may be executed for, for example, about 1 to 3 hours. The sacrificial layers 130 may be selectively removed. The sacrificial layers 130 may be removed to form gate regions GR. The gate regions GR may each be defined to refer to a space that extends from the first trench TR1 toward a gap between the interlayer dielectric layers 120.

There may be no removal of the sacrificial layers 130 in a space surrounded by the third trench TR3. A mold structure THS may be constituted by the lower dielectric pattern 110 in the space surrounded by the third trench TR3, and by the interlayer dielectric layers 120 and the sacrificial layers 130 that are alternately stacked on the lower dielectric pattern 110.

Referring back to FIGS. 5 and 6, gate electrodes ELa and ELb may be formed to fill the gate regions GR of FIG. 19. The gate electrodes ELa and ELb may be formed by forming a conductive layer that fills at least portions of the gate regions GR and of the first trenches TR1, and removing the conductive layer formed in the first trenches TR1. When the conductive layer is removed from the first trenches TR1, the gate electrodes ELa and ELb may be recessed from the first trenches TR1 toward gaps between the interlayer dielectric layers 120. Hereinafter, symbols ILDa and ILDb may be used to indicate the interlayer dielectric layers 120.

First spacer parts SP1 may be formed to conformally cover or overlap inner sidewalls of the first trenches TR1, and first filler parts FL1 may be formed to at least partially fill inner spaces of the first trenches TR1, which inner space is surrounded by the first spacer part SP1. First support structures WC1 may include the first spacer parts SP1 and the first filler parts FL1 that fill the first trenches TR1. The first support structures WC1 each including the first spacer part SP1 and the first filler part FL1 may have their top surfaces substantially coplanar with that of the second upper dielectric layer 250.

A third upper dielectric layer 270 may be formed to cover or overlap the top surface of the second upper dielectric layer 250, a top surface of the first spacer part SP1, and a top surface of the first filler part FL1. Bit-line contact plugs BPLG, cell contact plugs CPLG, and peripheral connection contact plugs PPLG may be formed to penetrate the first, second, and third upper dielectric layers 230, 250, and 270.

The bit-line contact plugs BPLG may be formed on the cell array region CAR and may be correspondingly connected to the conductive pads PAD of the vertical structures VS. The cell contact plugs CPLG may be formed on the extension region EXR, and may penetrate the first, second, and third upper dielectric layers 230, 250, and 270, ones of the interlayer dielectric layers ILDa and ILDb of the stack structures ST, and the planarized dielectric layer 210 to come into connection with the gate electrodes ELa and ELb. However, the cell contact plugs CPLG may not be formed on the mold structure THS.

The peripheral connection contact plug PPLG may penetrate the first, second, and third upper dielectric layers 230, 250, and 270, the planarized dielectric layer 210, the lower dielectric pattern 110, the sacrificial layers 130, and the interlayer dielectric layers ILDa and ILDb of the mold structure THS. The peripheral connection contact plug PPLG may be electrically connected to the peripheral transistors PTR of the peripheral circuit structure PS. The peripheral connection contact plug PPLG may be spaced apart from the third support structure WC3 and formed only on a location that overlaps the mold structure THS.

A bit line BL, first conductive lines CL1, and a second conductive line CL2 may be formed on the third upper dielectric layer 270 to come into connection with the bit-line contact plugs BPLG, the cell contact plugs CPLG, and the peripheral connection contact plug PPLG, respectively. A fourth upper dielectric layer 290 may be formed to cover or overlap the second conductive line CL2, the first conductive lines CL1, the bit line BL, and a top surface of the third upper dielectric layer 270.

Figure 20:
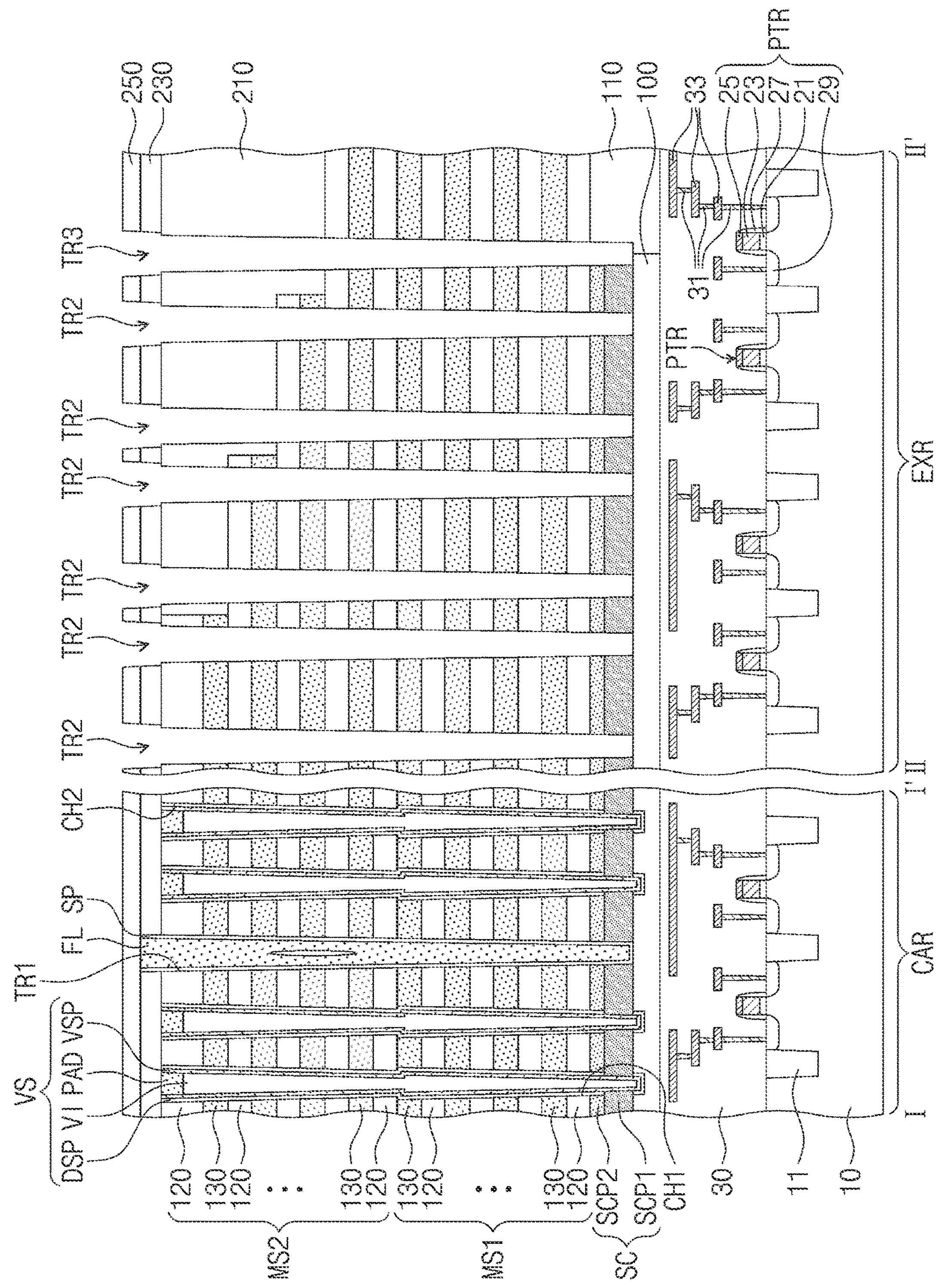
Figure 21:
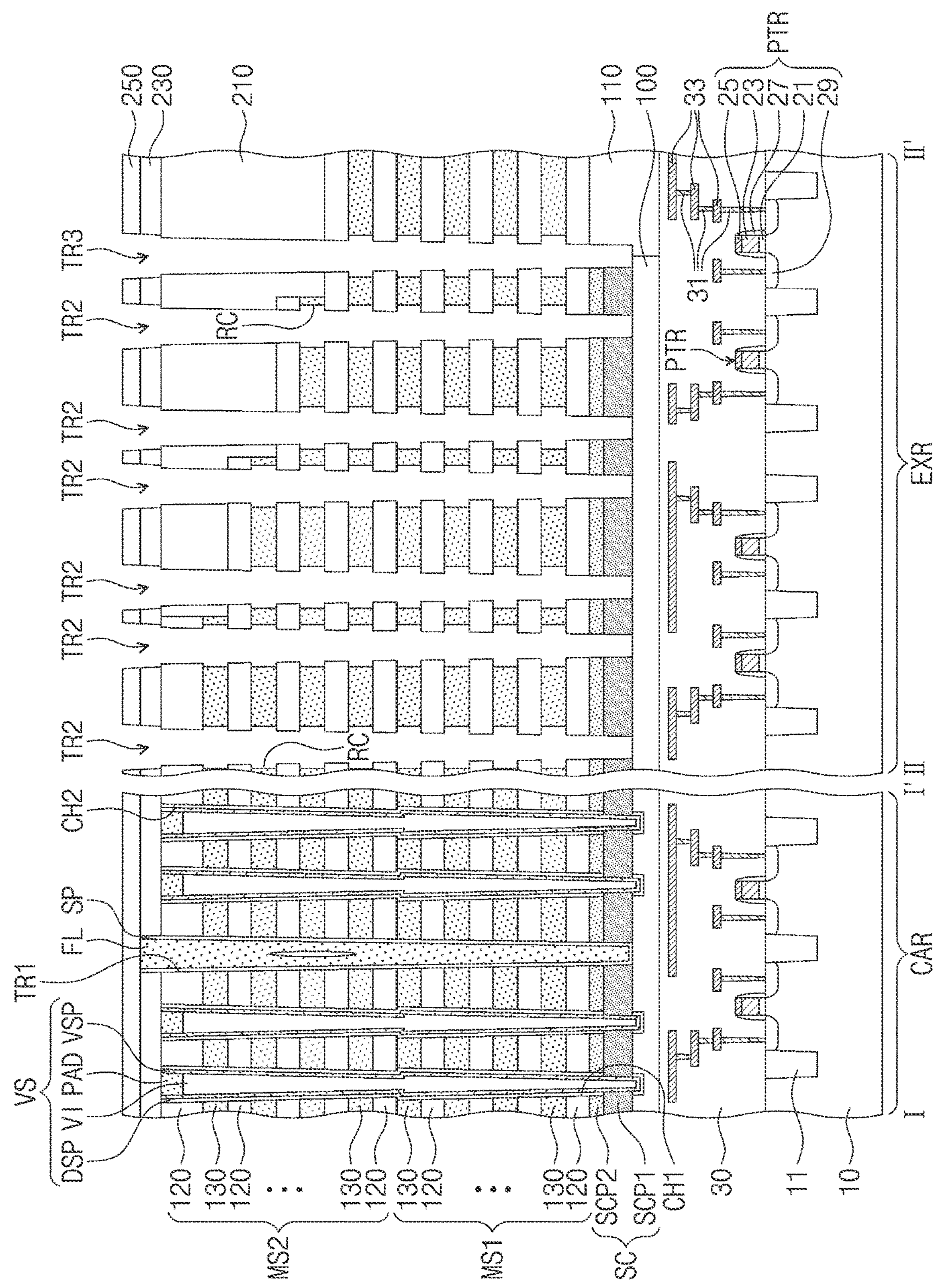

With reference to FIGS. 20 and 21, it will be discussed below a method of fabricating the three-dimensional semiconductor memory device according to the embodiment of FIG. 9. The fabrication methods discussed with reference to FIGS. 10 to 17 may be identically applicable to that of the three-dimensional semiconductor memory device discussed in the embodiment of FIG. 9. For convenience of description, the following will focus on fabrication processes after the step of FIG. 17.

Referring to FIG. 20, the first and second upper dielectric layers 230 and 250 may be patterned on their portions that overlap the second and third trenches TR2 and TR3. The first and second upper dielectric layers 230 and 250 may be partially patterned to externally expose the spacer parts SP and filler parts FL that fill the second and third trenches TR2 and TR3. Afterwards, the spacer parts SP and the filler parts FL may be removed from the second and third trenches TR2 and TR3. Therefore, the second and third trenches TR2 and TR3 may expose again the sidewalls of the interlayer dielectric layers 120 included in the first and second film structures MS1 and MS2, the sidewalls of the sacrificial layers 130, and at least a portion of the source structure SC.

Referring to FIG. 21, a fullback process may be performed to completely remove the spacer parts SP and the filler parts FL that remain in the second and third trenches TR2 and TR3. The fullback process may be performed by, for example, a wet etching process that uses an etchant including phosphoric acid. The fullback process may be executed for, for example, about 5 to 30 minutes. The fullback process may cause that the sidewalls of the sacrificial layers 130 exposed to the second and third trenches TR2 and TR3 may be recessed from the second and third trenches TR2 and TR3 toward gaps between the interlayer dielectric layers 120. Recessions RC may each be defined to indicate a zone where the sacrificial layer 130 is recessed toward a gap between the interlayer dielectric layers 120.

Referring back to FIGS. 5 and 9, second support structures WC2 may be formed to fill the second trenches TR2, and a third support structure WC3 may be formed to fill the third trench TR3. Each of the second support structures WC2 and WC3 may include second protrusions PP2 formed in the recessions RC.

As discussed with reference to FIGS. 18 and 19, the spacer parts SP and the filler parts FL may be removed from the first trenches TR1, and the sacrificial layers 130 exposed to the first trenches TR1 may be selectively removed. Thereafter, gate electrodes ELa and ELb may be formed in spaces from which the sacrificial layers 130 are removed, and first support structures WC1 may be formed in the first trenches TR1. Subsequent processes may be substantially the same as those in the method of fabricating the three-dimensional semiconductor memory device according to the embodiment of FIG. 6.

Figure 22:
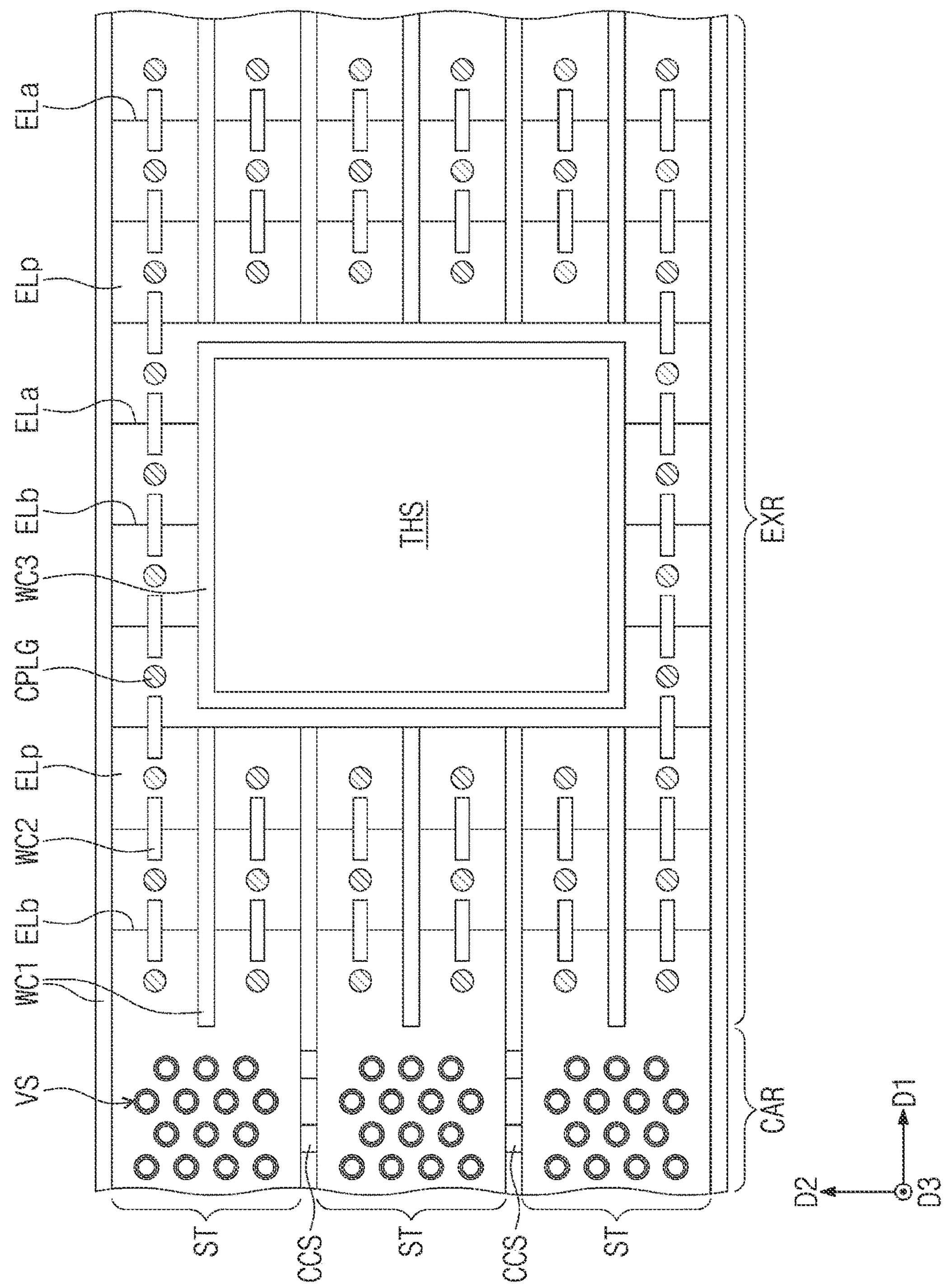
FIGS. 22 and 23 illustrate cross-sectional views showing a three-dimensional semiconductor memory device according to some example embodiments of the present inventive concepts.
Figure 23:
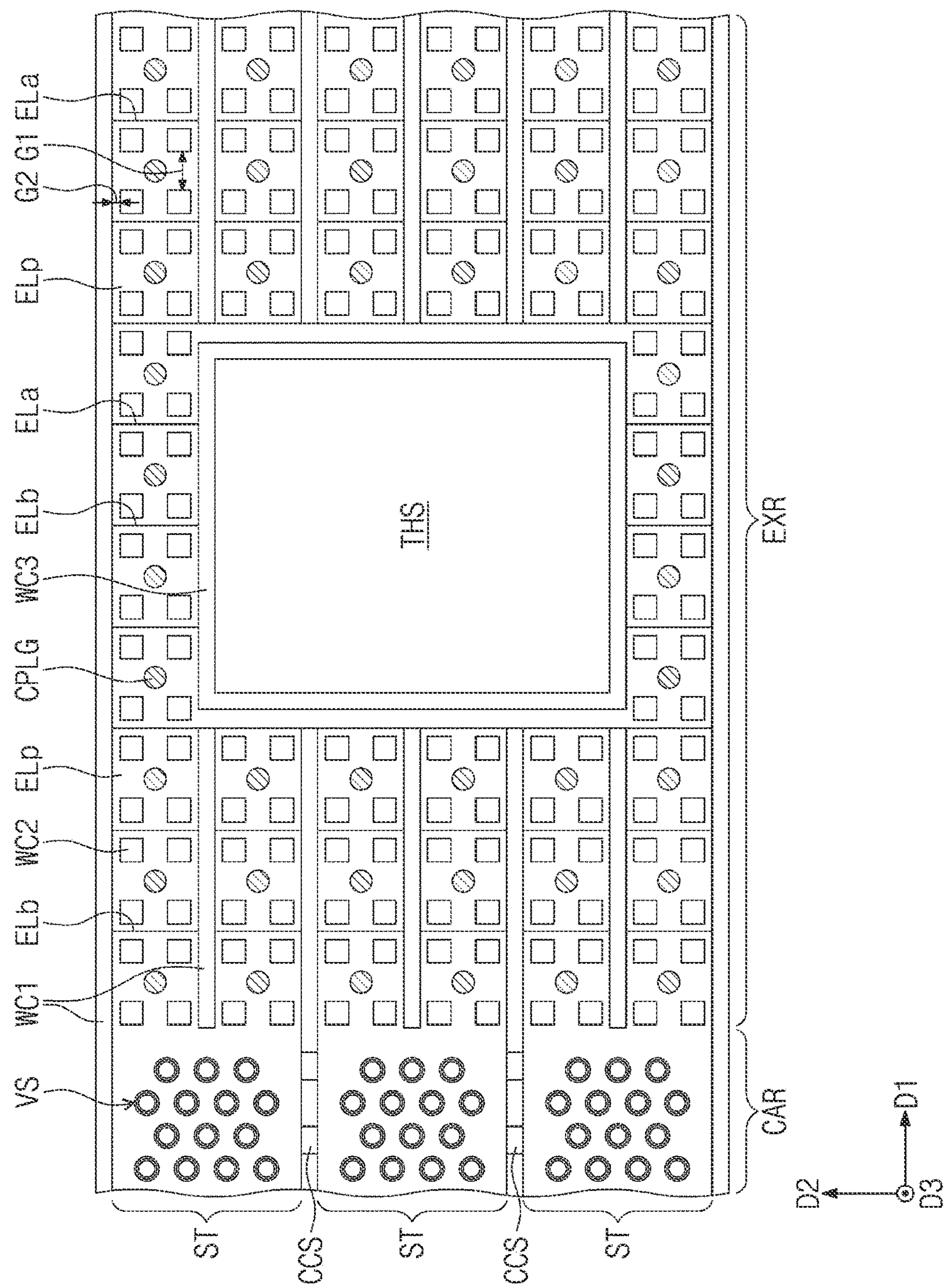

FIGS. 22 and 23 illustrate cross-sectional views showing a three-dimensional semiconductor memory device according to some example embodiments of the present inventive concepts. For convenience of description, omission will be made to avoid repetitive explanations of features substantially the same as those discussed with reference to FIG. 5.

Referring to FIG. 22, when viewed in plan, the second support structures WC2 may each extend in the first direction D1 between the cell contact plugs CPLG. The second support structures WC2 may not be in contact with the cell contact plugs CPLG while being spaced apart in the first direction D1 from the cell contact plugs CPLG. The second support structures WC2 may penetrate the pad portions ELp adjacent to each other in the first direction D1. The second support structures WC2 may each have a width in the first direction greater than a width in the second direction D2. The present inventive concepts, however, are not limited thereto, and the second support structures WC2 extending in the second direction D2 may be provided on various locations around the cell contact plugs CPLG.

Referring to FIG. 23, when viewed in plan, the second support structures WC2 may be correspondingly provided around the pad portions ELp of the gate electrodes ELa and ELb. Each of the second support structures WC2 may have a top surface shaped like square, rectangle, rhombus, circle, oval, polygonal, or any other form.

The second support structures WC2 that penetrate one of the pad portions ELp may be spaced apart from each other in the first and second directions D1 and D2. A first distance G1 may be defined to refer to an interval between the second support structures WC2 that are adjacent to each other across the cell contact plugs CPLG. A second distance G2 may be defined to refer to an interval between one of the second support structures WC2 and its adjacent one of the first support structures WC1. For example, the first distance G1 may range from about 230 nm to about 330 nm, and the second distance G2 may range from about 50 nm to about 200 nm. The second distance G2 may be, for example, about 100 nm to about 150 nm. The present inventive concepts, however, are not limited thereto, and the first distance G1 and the second distance G2 may be changed depending on an area of a top surface of each of the pad portions ELp and the cell contact plugs CPLG.

A three-dimensional semiconductor memory device according to some example embodiments of the present inventive concepts may be configured such that first, second, and third support structures may support stack structures, vertical structures on a cell array region, and a mold structure on an extension region, and that the first to third support structures may prevent collapse of the stack structures, the vertical structures, and the mold structure, with the result that the three-dimensional semiconductor memory device may improve in stability and/or electrical properties.

Moreover, according to a method of fabricating a three-dimensional semiconductor memory device in accordance with some example embodiments of the present inventive concepts, a misalignment may be prevented between vertical channels, and a trimming process on film structures may be performed one time to achieve simplification of fabrication process.

Although the present invention has been described in connection with the some example embodiments of the present inventive concepts illustrated in the accompanying drawings, it will be understood by one of ordinary skill in the art that variations in form and detail may be made therein without departing from the spirit and essential feature of the present inventive concepts. The above disclosed embodiments should thus be considered illustrative and not restrictive.

What is claimed is:

1. A three-dimensional semiconductor memory device, comprising:

a substrate comprising a cell array region and an extension region;

a plurality of stack structures which extend in a first direction and comprise a plurality of gate electrodes stacked on the substrate;

a plurality of vertical structures which penetrate the stack structures on the cell array region;

a mold structure on a portion of the extension region;

a first support structure which extends in the first direction between the stack structures;

a plurality of second support structures which penetrate the stack structures on the extension region and are spaced apart in a second direction from the first support structure, the second direction intersecting the first direction; and a third support structure which surrounds the mold structure in a plan view, wherein respective top surfaces of ones of the second support structures and a top surface of the third support structure are higher than top surfaces of ones of the vertical structures with respect to the substrate defining a base reference level, and wherein a bottom surface of the first support structure, respective bottom surfaces of the second support structures and a bottom surface of the third support structure are between a bottom surface of a lowermost one of the gate electrodes and a bottom surface of ones of the plurality of vertical structures.

2. The three-dimensional semiconductor memory device of claim 1, wherein ones of the second support structures and the third support structure comprise:

a spacer part on sidewalls of the gate electrodes of the stack structures; and a filler part on the spacer part.

3. The three-dimensional semiconductor memory device of claim 2, wherein the spacer part has a multi-layered structure comprising a first layer and a second layer that is between the first layer and the filler part.

4. The three-dimensional semiconductor memory device of claim 3, wherein the first layer comprises silicon oxide, wherein the second layer comprises silicon nitride, and wherein the filler part comprises polysilicon or silicon oxide.

5. The three-dimensional semiconductor memory device of claim 2, wherein the spacer part has a single-layered structure, and wherein the spacer part comprises silicon oxide.

6. The three-dimensional semiconductor memory device of claim 2, wherein the filler part includes a seam therein that is void of a material of the filler part.

7. The three-dimensional semiconductor memory device of claim 1, wherein a top surface of the first support structure is higher than the respective top surfaces of the ones of the second support structures and the third support structure.

8. The three-dimensional semiconductor memory device of claim 1, wherein the stack structures further comprise a plurality of interlayer dielectric layers between the gate electrodes, and wherein the first support structure comprises a plurality of protrusions which protrude toward the gate electrodes between the interlayer dielectric layers.

9. The three-dimensional semiconductor memory device of claim 1, wherein a top surface of the first support structure is at a same level as the top surface of the ones of the second support structures and the third support structure.

10. The three-dimensional semiconductor memory device of claim 1, wherein the stack structures further comprise a plurality of interlayer dielectric layers between the gate electrodes, and wherein the ones of the second support structures and the third support structure comprise a plurality of protrusions which protrude toward the gate electrodes between the interlayer dielectric layers.

11. The three-dimensional semiconductor memory device of claim 1, wherein the mold structure comprises a plurality of interlayer dielectric layers and a plurality of sacrificial layers which are alternately stacked, and wherein the mold structure is electrically separated from the stack structures by the third support structure.

12. The three-dimensional semiconductor memory device of claim 1, further comprising:

a peripheral circuit structure between the substrate and the stack structures, the peripheral circuit structure comprising a peripheral circuit;

a planarized dielectric layer on the stack structures and on the mold structure on the extension region; and a peripheral connection contact plug which penetrates the planarized dielectric layer and the mold structure, and is electrically connected to the peripheral circuit, wherein the peripheral connection contact plug is spaced apart from the third support structure.

13. The three-dimensional semiconductor memory device of claim 1, wherein ones of the gate electrodes of the stack structures comprise respective pad portions which collectively comprise a stepwise structure on the extension region, and wherein ones of the second support structures penetrate the respective pad portions.

14. The three-dimensional semiconductor memory device of claim 13, further comprising:

a planarized dielectric layer on the stack structures on the extension region; and a cell contact plug which penetrates the planarized dielectric layer and is in contact with a top surface of a corresponding one of the pad portions, wherein the cell contact plug is spaced apart from the second support structures.

15. A three-dimensional semiconductor memory device, comprising:

a first substrate comprising a cell array region and an extension region;

a peripheral circuit structure comprising a peripheral circuit on the first substrate;

a second substrate on the peripheral circuit structure; and a cell array structure on the second substrate, wherein the cell array structure comprises:

a plurality of stack structures which extend in a first direction and comprise a plurality of gate electrodes and a plurality of interlayer dielectric layers which are alternately stacked on the second substrate;

a plurality of vertical structures which penetrate the stack structures on the cell array region;

respective bit-line contact plugs connected to respective ones of the vertical structures;

respective cell contact plugs connected to respective ones of the gate electrodes on the extension region;

a mold structure on a portion of the extension region;

a peripheral connection contact plug which penetrates the mold structure and the second substrate, and is electrically connected to the peripheral circuit structure;

a first support structure which extends in the first direction between the stack structures;

a plurality of second support structures which penetrate the stack structures on the extension region and are spaced apart in a second direction from the first support structure, the second direction intersecting the first direction; and a third support structure which surrounds the mold structure in a plan view, wherein top surfaces of ones of the second support structures and a top surface of the third support structure are higher than top surfaces of ones of the vertical structures with respect to the second substrate defining a base reference level, wherein the ones of the second support structures and the third support structure each comprise a spacer part and a filler part that is in a space surrounded by the spacer part in a plan view, and wherein a top surface of the first support structure is higher than the top surfaces of the ones of the second support structures and the top surface of the third support structure with respect to the second substrate defining the base reference level.

16. The three-dimensional semiconductor memory device of claim 15, wherein the cell array structure further comprises a source conductive pattern between the second substrate and the stack structures, wherein ones of the vertical structures are in respective vertical channels which penetrate the stack structures, wherein the ones of the vertical structures comprise a data storage pattern which is conformally on a sidewall of a respective one of the vertical channels and a vertical semiconductor pattern surrounded by the data storage pattern in a plan view, and wherein the source conductive pattern is in contact with the vertical semiconductor pattern.

17. The three-dimensional semiconductor memory device of claim 15, wherein the ones of the second support structures and the third support structure each comprise a plurality of protrusions which protrude toward the gate electrodes between the interlayer dielectric layers, and wherein a top surface of the first support structure is at a same level as the top surfaces of the ones of the second support structures and the top surface of the third support structure.

18. An electronic system, comprising:

a main board;

a three-dimensional semiconductor memory device on the main board; and a controller on the main board that is electrically connected to the three-dimensional semiconductor memory device, wherein the three-dimensional semiconductor memory device comprises:

a first substrate comprising a cell array region and an extension region;

a peripheral circuit structure comprising a peripheral circuit on the first substrate;

a second substrate on the peripheral circuit structure;

a plurality of stack structures which extend in a first direction and comprise a plurality of gate electrodes stacked on the second substrate;

a plurality of vertical structures which penetrate the stack structures on the cell array region;

a mold structure on a portion of the extension region;

a first support structure which extends in the first direction between the stack structures;

a plurality of second support structures which penetrate the stack structures on the extension region and are spaced apart in a second direction from the first support structure, the second direction intersecting the first direction;

a third support structure which surrounds the mold structure in plan view; and an input/output pad electrically connected to the peripheral circuit, wherein respective top surfaces of ones of the second support structures and a top surface of the third support structure are higher than a top surfaces of ones of the vertical structures with respect to the second substrate defining a base reference level, and wherein a bottom surface of the first support structure, respective bottom surfaces of the second support structures and a bottom surface of the third support structure are between a bottom surface of a lowermost one of the gate electrodes and a bottom surface of ones of the plurality of vertical structures.

* * * * *